(12) United States Patent
Pradhan et al.

(10) Patent No.: US 7,842,605 B1
(45) Date of Patent: Nov. 30, 2010

(54) ATOMIC LAYER PROFILING OF DIFFUSION BARRIER AND METAL SEED LAYERS

(75) Inventors: Anshu A. Pradhan, San Jose, CA (US); Robert Rozbicki, San Francisco, CA (US)

(73) Assignee: Novellus Systems, Inc., San Jose, CA (US)

( * ) Notice: Subject to any disclaimer, the term of this patent is extended or adjusted under 35 U.S.C. 154(b) by 617 days.

(21) Appl. No.: 11/807,179

(22) Filed: May 24, 2007

Related U.S. Application Data

(63) Continuation-in-part of application No. 11/588,586, filed on Oct. 26, 2006, which is a continuation-in-part of application No. 10/804,353, filed on Mar. 18, 2004, now Pat. No. 7,186,648, which is a continuation-in-part of application No. 10/412,562, filed on Apr. 11, 2003, now Pat. No. 6,764,940.

(51) Int. Cl.
*H01L 21/4763* (2006.01)
(52) U.S. Cl. ............... 438/627; 438/628; 257/E21.582
(58) Field of Classification Search ................ 438/627, 438/628; 257/E21.582
See application file for complete search history.

(56) References Cited

U.S. PATENT DOCUMENTS

| | | | |
|---|---|---|---|
| 3,763,031 A | 10/1973 | Scow et al. | |
| 3,767,551 A | 10/1973 | Lang et al. | |
| 4,058,430 A | 11/1977 | Suntola et al. | |
| 4,492,620 A | 1/1985 | Matsuo et al. | |
| 4,588,490 A | 5/1986 | Cuomo et al. | |
| 4,604,180 A | 8/1986 | Hirukawa et al. | |
| 4,609,903 A | 9/1986 | Toyokura et al. | |

(Continued)

FOREIGN PATENT DOCUMENTS

EP 0 692 551 A1 1/1996

(Continued)

OTHER PUBLICATIONS

U.S. Final Office Action for U.S. Appl. No. 11/588,586 mailed Nov. 4, 2009.

(Continued)

*Primary Examiner*—W. David Coleman
*Assistant Examiner*—Sun M Kim
(74) *Attorney, Agent, or Firm*—Weaver Austin Villeneuve & Sampson LLP

(57) ABSTRACT

Material is removed from a substrate surface (e.g., from a bottom portion of a recessed feature on a partially fabricated semiconductor substrate) by subjecting the surface to a plurality of profiling cycles, wherein each profiling cycle includes a net etching operation and a net depositing operation. An etching operation removes a greater amount of material than is being deposited by a depositing operation, thereby resulting in a net material etch-back per profiling cycle. About 2-10 profiling cycles are performed. The profiling cycles are used for removing metal-containing materials, such as diffusion barrier materials, copper line materials, and metal seed materials by PVD deposition and resputter. Profiling with a plurality of cycles removes metal-containing materials without causing microtrenching in an exposed dielectric. Further, overhang is reduced at the openings of the recessed features and sidewall material coverage is improved. Integrated circuit devices having higher reliability are fabricated.

37 Claims, 14 Drawing Sheets

U.S. PATENT DOCUMENTS

| | | | |
|---|---|---|---|
| 4,622,121 A | 11/1986 | Wegmann et al. | |
| 4,737,384 A | 4/1988 | Murthy et al. | |
| 4,874,493 A | 10/1989 | Pan | |
| 4,963,524 A | 10/1990 | Yamazaki | |
| 4,999,096 A | 3/1991 | Nihei et al. | |
| 5,009,963 A | 4/1991 | Ohmi et al. | |
| 5,084,412 A | 1/1992 | Nakasaki | |
| 5,126,028 A | 6/1992 | Hurwitt et al. | |
| 5,139,825 A | 8/1992 | Gordon et al. | |
| 5,178,739 A | 1/1993 | Barnes et al. | |
| 5,194,398 A | 3/1993 | Miyachi et al. | |
| 5,221,449 A | 6/1993 | Colgan et al. | |
| 5,281,485 A | 1/1994 | Colgan et al. | |
| 5,298,091 A | 3/1994 | Edwards, III et al. | |
| 5,378,506 A | 1/1995 | Imai et al. | |
| 5,482,611 A | 1/1996 | Helmer et al. | |
| 5,622,608 A | 4/1997 | Lanford et al. | |
| 5,629,221 A | 5/1997 | Chao et al. | |
| 5,654,233 A | 8/1997 | Yu | |
| 5,656,860 A | 8/1997 | Lee | |
| 5,766,379 A | 6/1998 | Lanford et al. | |
| 5,789,027 A | 8/1998 | Watkins et al. | |
| 5,801,089 A | 9/1998 | Kenney | |
| 5,882,488 A | 3/1999 | Leiphart | |
| 5,904,565 A | 5/1999 | Nguyen et al. | |
| 5,948,215 A | 9/1999 | Lantsman | |
| 5,962,923 A | 10/1999 | Xu et al. | |
| 5,969,422 A | 10/1999 | Ting et al. | |
| 5,985,762 A | 11/1999 | Geffken et al. | |
| 6,037,257 A | 3/2000 | Chiang et al. | |
| 6,046,108 A | 4/2000 | Liu et al. | |
| 6,074,544 A | 6/2000 | Reid et al. | |
| 6,077,403 A | 6/2000 | Kobayashi et al. | |
| 6,077,780 A | 6/2000 | Dubin | |
| 6,080,285 A | 6/2000 | Liu et al. | |
| 6,093,966 A | 7/2000 | Venkatraman et al. | |
| 6,099,702 A | 8/2000 | Reid et al. | |
| 6,100,200 A | 8/2000 | Van Buskirk et al. | |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,200,893 B1 | 3/2001 | Sneh | |
| 6,203,613 B1 | 3/2001 | Gates et al. | |
| 6,214,711 B1 | 4/2001 | Hu | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 | 6/2001 | Fu et al. | |
| 6,271,591 B1 | 8/2001 | Dubin et al. | |
| 6,274,008 B1 | 8/2001 | Gopalraja et al. | |
| 6,277,249 B1 | 8/2001 | Gopalraja et al. | |
| 6,280,597 B1 | 8/2001 | Kashiwada et al. | |
| 6,287,977 B1 | 9/2001 | Hashim et al. | |
| 6,333,547 B1 | 12/2001 | Tanaka et al. | |
| 6,340,435 B1 | 1/2002 | Bjorkman et al. | |
| 6,342,133 B2 | 1/2002 | D'Couto et al. | |
| 6,342,448 B1 | 1/2002 | Lin et al. | |
| 6,350,353 B2 | 2/2002 | Gopalraja et al. | |
| 6,358,376 B1 | 3/2002 | Wang et al. | |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1 | 6/2002 | Rich | |
| 6,417,094 B1 | 7/2002 | Zao et al. | |
| 6,440,854 B1 | 8/2002 | Rozbicki | |
| 6,448,176 B1 | 9/2002 | Grill et al. | |
| 6,451,177 B1 | 9/2002 | Gopalraja et al. | |
| 6,492,262 B2 | 12/2002 | Uzoh | |
| 6,498,091 B1 | 12/2002 | Chen et al. | |
| 6,500,762 B2 | 12/2002 | Hashim et al. | |
| 6,509,267 B1 | 1/2003 | Woo et al. | |
| 6,538,324 B1 | 3/2003 | Tagami et al. | |
| 6,541,374 B1 | 4/2003 | de Felipe et al. | |
| 6,554,914 B1 | 4/2003 | Rozbicki et al. | |
| 6,559,061 B2 | 5/2003 | Hashim et al. | |
| 6,562,715 B1 | 5/2003 | Chen et al. | |
| 6,566,246 B1 | 5/2003 | de Felipe et al. | |
| 6,589,887 B1 | 7/2003 | Dalton et al. | |
| 6,605,534 B1 | 8/2003 | Chung et al. | |
| 6,607,977 B1 | 8/2003 | Rozbicki et al. | |
| 6,607,982 B1 | 8/2003 | Powell et al. | |
| 6,613,199 B1 | 9/2003 | Tobin et al. | |
| 6,624,066 B2 * | 9/2003 | Lu et al. | 438/637 |
| 6,642,146 B1 | 11/2003 | Rozbicki et al. | |
| 6,652,718 B1 | 11/2003 | D'Couto et al. | |
| 6,656,841 B1 | 12/2003 | Kim | |
| 6,660,622 B2 | 12/2003 | Chen et al. | |
| 6,673,716 B1 | 1/2004 | D'Couto et al. | |
| 6,706,155 B2 | 3/2004 | Morimoto et al. | |
| 6,709,557 B1 | 3/2004 | Kailasam et al. | |
| 6,709,987 B2 | 3/2004 | Hashim et al. | |
| 6,755,945 B2 | 6/2004 | Yasar et al. | |
| 6,758,947 B2 | 7/2004 | Chiang et al. | |
| 6,764,940 B1 | 7/2004 | Rozbicki et al. | |
| 6,784,096 B2 | 8/2004 | Chen et al. | |
| 6,790,776 B2 | 9/2004 | Ding et al. | |
| 6,841,044 B1 | 1/2005 | Ruzic | |
| 6,893,541 B2 | 5/2005 | Chiang et al. | |
| 6,905,965 B2 | 6/2005 | Subrahmanyan et al. | |
| 6,919,275 B2 | 7/2005 | Chiang et al. | |
| 6,943,111 B2 | 9/2005 | Lin et al. | |
| 6,949,457 B1 | 9/2005 | Fiordalice et al. | |
| 6,969,448 B1 | 11/2005 | Lau | |
| 6,992,012 B2 | 1/2006 | Haskim et al. | |
| 7,030,031 B2 | 4/2006 | Wille et al. | |
| 7,037,830 B1 | 5/2006 | Rumer et al. | |
| 7,048,837 B2 | 5/2006 | Somekh et al. | |
| 7,074,714 B2 | 7/2006 | Chiang et al. | |
| 7,135,402 B2 | 11/2006 | Lin et al. | |
| 7,186,648 B1 | 3/2007 | Rozbicki et al. | |
| 7,253,109 B2 | 8/2007 | Ding et al. | |
| 7,294,574 B2 | 11/2007 | Ding et al. | |
| 7,365,001 B2 | 4/2008 | Yang et al. | |
| 7,510,634 B1 | 3/2009 | Klawuhn et al. | |
| 7,645,696 B1 | 1/2010 | Dulkin et al. | |
| 7,659,197 B1 | 2/2010 | Juliano | |
| 7,682,966 B1 | 3/2010 | Rozbicki et al. | |
| 2001/0039113 A1 | 11/2001 | Blalock et al. | |
| 2002/0000382 A1 | 1/2002 | Morrissey et al. | |
| 2002/0041028 A1 | 4/2002 | Choi et al. | |
| 2002/0110999 A1 | 8/2002 | Lu et al. | |
| 2002/0153610 A1 | 10/2002 | Stumborg et al. | |
| 2003/0034244 A1 | 2/2003 | Yasar et al. | |
| 2003/0116427 A1 | 6/2003 | Ding et al. | |
| 2003/0129828 A1 | 7/2003 | Cohen | |
| 2004/0048461 A1 | 3/2004 | Chen | |
| 2004/0134769 A1 | 7/2004 | Wang et al. | |
| 2004/0171250 A1 | 9/2004 | Chiang et al. | |
| 2004/0188239 A1 | 9/2004 | Robison et al. | |
| 2004/0211661 A1 | 10/2004 | Zhang et al. | |
| 2004/0224507 A1 | 11/2004 | Marieb et al. | |

| | | |
|---|---|---|
| 2005/0006222 A1 | 1/2005 | Ding et al. |
| 2005/0020080 A1 | 1/2005 | Chiang et al. |
| 2005/0032382 A1 | 2/2005 | Rossman |
| 2005/0085068 A1 | 4/2005 | Chiang et al. |
| 2005/0085070 A1 | 4/2005 | Park |
| 2005/0103620 A1 | 5/2005 | Chistyakov |
| 2005/0106865 A1 | 5/2005 | Chung et al. |
| 2005/0110147 A1 | 5/2005 | Wu et al. |
| 2005/0173239 A1 | 8/2005 | Somekh et al. |
| 2005/0186793 A1 | 8/2005 | Omoto et al. |
| 2005/0211545 A1 | 9/2005 | Cerio, Jr. et al. |
| 2005/0252765 A1 | 11/2005 | Zhang et al. |
| 2005/0255690 A1 | 11/2005 | Chen et al. |
| 2005/0255691 A1 | 11/2005 | Ding et al. |
| 2005/0255700 A1 | 11/2005 | Gopalraja et al. |
| 2005/0266682 A1 | 12/2005 | Chen et al. |
| 2005/0272254 A1 | 12/2005 | Ding et al. |
| 2006/0014378 A1 | 1/2006 | Aggrawal et al. |
| 2006/0024939 A1 | 2/2006 | Grunow et al. |
| 2006/0024953 A1 | 2/2006 | Rao et al. |
| 2006/0030151 A1 | 2/2006 | Ding et al. |
| 2006/0057843 A1 | 3/2006 | Chen et al. |
| 2006/0125100 A1 | 6/2006 | Arakawa |
| 2006/0148253 A1 | 7/2006 | Chung et al. |
| 2006/0207873 A1 | 9/2006 | Fu |
| 2006/0258152 A1 | 11/2006 | Haider |
| 2007/0020922 A1 | 1/2007 | Chiang et al. |
| 2007/0178682 A1 | 8/2007 | Chiang et al. |
| 2007/0193982 A1 | 8/2007 | Brown et al. |
| 2007/0197012 A1 | 8/2007 | Yang et al. |
| 2007/0252277 A1* | 11/2007 | Tsao et al. .................. 438/637 |
| 2007/0283886 A1 | 12/2007 | Chung et al. |
| 2008/0142359 A1 | 6/2008 | Gopalraja et al. |
| 2008/0190760 A1 | 8/2008 | Tang et al. |
| 2008/0310005 A1 | 12/2008 | Tonar et al. |
| 2009/0095617 A1 | 4/2009 | Lee et al. |
| 2009/0233438 A1 | 9/2009 | Ding et al. |
| 2010/0009533 A1 | 1/2010 | Shaviv et al. |

FOREIGN PATENT DOCUMENTS

JP           11-186273        9/1999

OTHER PUBLICATIONS

Rozbicki et al., "Multistep Method of Depositing Metal Seed Layers" Novellus Systems, Inc., U.S. Appl. No. 12/699,738, filed Feb. 3, 2010.

U.S. Office Action mailed Mar. 2, 2010 for U.S. Appl. No. 11/807,182.

U.S. Office Action mailed Mar. 5, 2010 for U.S. Appl. No. 11/807,178.

U.S. Notice of Allowance and Allowed Claims, mailed Mar. 8, 2010 for U.S. Appl. No. 11/714,465.

U.S. Final Office Action mailed Mar. 11, 2010 for U.S. Appl. No. 12/122,118.

U.S. Final Office Action mailed Apr. 15, 2010 for U.S. Appl. No. 12/154,984.

Rozbicki et al., "Method of Depositing a Diffusion Barrier for Copper Interconnect Applications", Novellus Systems, Inc., U.S. Appl. No. 12/764,870, filed Apr. 21, 2010.

Shaviv et al., "PVD-Based Metallization Methods for Fabrication of Interconnections in Semiconductor Devices", Novellus Systems, Inc., U.S. Appl. No. 12/074,168, filed Feb. 29, 2009.

U.S. Notice of Allowance, mailed Feb. 17, 2010 for U.S. Appl. No. 12/074,168.

U.S. Office Action mailed Aug. 12, 2009 for U.S. Appl. No. 12/074,168.

Schumacher Products, TDEAT (Tetrakis-diethylamino Titanium), Electronic Grade, www.schumacher.com/tdeat.html, printed Jun. 5, 2001, 1 page.

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10. mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics", Thin Film Solids, 346 (1999) , 1-68, (c) 1999.

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of A1 to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Fims by Remote Plasma Enhanced Chemical Vapor Deposition (Remote PECVD)," Feb.

1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2006, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J. Vac. Sci. Technol. B 18(2), Mar./Apr. 2000, pp. 820-833.

Hoekstra et al., "Microtenching resulting from specular reflection during chlorine etching of silicon," J. Vac. Sci. Technol. B 16(4), Jul./Aug. 1998, pp. 2102-2104.

Lane et al., "Feature evolution during plasma etching. II. Polycrystalline silicone etching," J. Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between A Diffusion Barrier Layer and A Seed Layer," Novellus Systems, Inc., U.S. Appl. No. 11/807,178, filed May 24, 2007.

Wu et al., "Deposition of Doped Copper Seed Layers Having Improved Reliability," Novellus Systems, Inc., U.S. Appl. No. 12/122,118, filed May 16, 2008.

U.S. Office Action mailed Jun. 26, 2008, from U.S. Appl. No. 11/473,618.

U.S. Office Action mailed May 2, 2008, from U.S. Appl. No. 11/558,693.

U.S. Office Action mailed Dec. 12, 2008, from U.S. Appl. No. 11/714,465.

Notice of Allowance and Fee Due mailed Nov. 24, 2008, from U.S Appl. No. 11/558,693

Allowed Claims from U.S Appl. No. 11/558,693, 2008.

U.S. Final Office Action mailed Dec. 10, 2008, from U.S. Appl. No. 11/473,618.

U.S. Office Action mailed Nov. 14, 2008, from U.S. Appl. No. 11/701,984.

Notice of Allowance and Fee Due mailed Apr. 13, 2004, from U.S Appl. No. 10/412,562.

Allowed Claims from U.S Appl. No. 10/412,562, 2004.

Notice of Allowance and Fee Due mailed Oct. 3, 2006, from U.S Appl. No. 10/804,353.

Allowed Claims from U.S Appl. No. 10/804,353, 2006.

Wu et al., "Methods and Apparatus for Depositing Titanium Based Diffusion Barrier Films," Novellus Systems, Inc., U.S. Appl. No. 12/154,984, filed May 28, 2008.

U.S. Office Action mailed on Mar. 6, 2009 for U.S. Appl. No. 11/903,487.

U.S. Office Action mailed on Feb. 23, 2009 for U.S. Appl. No. 11/701,984.

U.S. Office Action mailed on Mar. 24, 2009 for U.S. Appl. No. 11/473,618.

U.S. Office Action mailed on May 5, 2009 for U.S. Appl. No. 11/588,586.

U.S. Office Action mailed on May 26, 2009 for U.S. Appl. No. 11/564,222.

U.S. Final Office Action mailed Jun. 17, 2009 for U.S. Appl. No. 11/701,984.

U.S. Office Action mailed Aug. 3, 2009 for U.S. Appl. No. 11/714,465.

Shaviv et al., "Conformal Films on Semiconductor Substrates" Novellus Systems, Inc., U.S. Appl. No. 12/467,200, filed May 15, 2009.

Notice of Allowance, mailed Sep. 18, 2009 for U.S. Appl. No. 11/903,487.

U.S. Office Action for U.S. Appl. No. 12/154,984, mailed Oct. 6, 2009.

D'Couto et al. J. Vac. Sci. Technol. B. 2001, 19(1), pp. 244-249.

* cited by examiner

ATOMIC LAYER PROFILING OF DIFFUSION BARRIER AND METAL SEED LAYERS

CROSS-REFERENCE TO RELATED APPLICATIONS

This application is a continuation-in-part claiming priority under 35 USC 120 from U.S. patent application Ser. No. 11/588,586 filed Oct. 26, 2006 (now U.S. Pat. No. 7,781,327 issued Aug. 24, 2010), titled "Resputtering Process for Eliminating Dielectric Damage", naming Kailasam et al. as inventors, which is a continuation-in-part of U.S. application Ser. No. 10/804,353 now U.S. Pat. No. 7,186,648 filed Mar. 18, 2004 (issued Mar. 6, 2007), titled "Barrier First Method For Single Damascene Trench Applications," naming Rozbicki et al. as inventors which is a continuation-in-part of U.S. application Ser. No. 10/412,562 now U.S. Pat. No. 6,764,940 filed Apr. 11, 2003 (issued Jul. 20, 2004) titled "Method For Depositing A Diffusion Barriers For Copper Interconnect Applications," naming Rozbicki and Danek as inventors. Each of these references is incorporated herein by reference in its entirety for all purposes.

FIELD OF THE INVENTION

The present invention pertains to methods of resputtering layers of material on a partially fabricated integrated circuit. The methods are particularly useful for sputter etching diffusion barrier layers and copper seed layers. The methods can also be applied for sputter etch back of other wafer materials, such as conductive lines.

BACKGROUND OF THE INVENTION

Miniaturization of integrated circuit (IC) devices demands superior electrical properties from both dielectric and conductive materials used in the manufacturing of an integrated circuit. Dielectric materials with low dielectric constant (low-k and ultra low-k dielectrics) have replaced the traditionally used silicon dioxide as an inter-layer dielectric (ILD) material, while copper has replaced aluminum as a conducting material in many applications due to its lower resistivity. The low-k dielectric materials used in the IC device processing include carbon doped silicon dioxide, hydrogenated silicon oxycarbides (SiCOH), fluorine doped silicon dioxide, and organic-containing low-k dielectrics. These materials, due to their low dielectric constants, provide low parasitic capacitance and minimize the "crosstalk" between the interconnects in an integrated circuit. At the same time, they are often porous foam-like materials and are generally more easily damaged during the processing steps than silicon dioxide.

Currently used IC fabrication processes often include operations that remove or redistribute material on a wafer surface using ions generated in a plasma. These operations are often referred to as sputter etching or resputtering. In such methods, positively charged inert gas ions or metal ions impinge on a negatively biased substrate and remove or redistribute portions of exposed material residing on a wafer substrate. Examples of materials that can be removed or redistributed using sputter etching and resputtering include diffusion barrier materials, such as Ta and $TaN_x$, and seed layer materials, such as copper and its alloys. These materials usually reside on a layer of a low-k dielectric, which in traditionally used methods is not exposed to plasma during resputtering.

SUMMARY OF THE INVENTION

With an ongoing miniaturization of IC devices, especially with processing of devices at a 65 nm technology node and at more advanced nodes, it became more challenging to perform resputtering without exposing dielectric layers to plasma. It was noted that a layer of dielectric can become exposed during resputter, especially when large amounts of diffusion barrier or other material are removed from the wafer substrate. When resputtering is performed under conventional conditions, the exposed dielectric material can easily become damaged by high-energy ions that impinge upon it. One type of such damage is microtrenching, which manifests itself in increased dielectric etching at particular locations within the recessed features of the wafer. In one typical example, microtrenches are formed in the proximity of the sidewalls in the bottom portions of the recessed features, e.g., in the trench bottoms. Microtrenching leads to decreased reliability of the formed IC devices due to reduced adhesion of the subsequently deposited layers. Further, microtrenching contributes to an increase in line-to-line leakage due to a local increase in current densities in the microtrenches. It was therefore recognized, that there is a need for a resputtering method that would remove material from the wafer surface without causing microrotrenching in the exposed dielectric layer.

It was discovered that microtrenching can be significantly decreased and even eliminated, if etch-back operation is performed in a plurality of profiling cycles, each including a deposition step and an etch step, rather than in a single long resputtering operation. This was an unexpected finding, since the dielectric can be exposed to a resputtering plasma for a substantially the same amount of time during one long resputtering step and during many short resputtering operations performed in the profiling cycles. Yet, in the case where the resputtering operation is broken up with short deposition steps, microtrenching is substantially reduced.

According to one embodiment, material is removed from a substrate surface (e.g., from a bottom portion of a recessed feature on a partially fabricated semiconductor substrate) by subjecting the surface to a plurality of profiling cycles, wherein each profiling cycle includes a net etching operation and a net depositing operation. An etching operation removes a greater amount of material than is being deposited by a depositing operation, thereby resulting in a net material etchback per profiling cycle. About 2-10 profiling cycles are typically performed. The profiling cycles are used for removing metal-containing materials, such as diffusion barrier materials, copper line materials, and metal seed materials using PVD deposition and resputter. Profiling with a plurality of cycles removes metal-containing materials without causing microtrenching in an exposed dielectric. Further, overhang is reduced at the openings of the recessed features and sidewall material coverage is improved. Integrated circuit devices having higher reliability are fabricated.

While provided profiling methods are particularly advantageous for performing etch-back on substrates having exposed dielectric layers, these methods are not limited to this application. In some embodiments, provided methods can be used on substrates that do not include exposed dielectric. For example, provided methods can be used to reduce overhang, to improve sidewall coverage, and to achieve improved shaping of recessed features.

One aspect of the invention pertains to a method of processing a layer of material on a semiconductor substrate having a recessed feature. The method includes an operation of depositing a layer of diffusion barrier material (e.g., Ta, $TaN_x$, or a $TaN_x$/Ta bi-layer) on the substrate and an operation of performing a plurality of profiling cycles. The diffusion barrier material is deposited on at least the bottom portion of the recessed feature. Each profiling cycle includes a net etch-back operation removing a first portion of a material residing at the bottom of the recessed feature and a net deposition operation depositing a second portion of a material at the bottom of the recessed feature, the removed portion of the material being greater than the deposited portion of the material for at least one of the profiling cycles. The profiling cycles achieve net material etching at the bottom of the recessed feature. The net etch and net deposition operations typically alternate when profiling cycles are performed. The first profiling cycle may start with a net etch operation, followed by a net deposition in some embodiments. In other embodiments, the first profiling cycle starts with a net deposition followed by a net etch-back.

In some embodiments, performing about 2-10 profiling cycles, preferably 4-6 profiling cycles is sufficient to etch a significant amount of material on a wafer surface (e.g., about 500 Å of Ta, $TaN_x$, Cu and mixtures thereof) without causing substantial microtrenching in an exposed dielectric. In some embodiments 5 profiling cycles are performed. In other embodiments, especially when smaller amounts of material are removed, 2 profiling cycles may be sufficient.

Profiling cycles are designed to deposit and remove small amounts of material, allowing atomic-level control over feature profiles. In one embodiment a single profiling cycle removes between about 5 Å and about 100 Å, preferably between about 10 Å and about 50 Å of material from the bottom portion of the recessed feature. In a profiling cycle, the depositing operation typically deposits less than about 100 Å, e.g., between about 5-20 Å of material in the bottom portion of the recessed feature. The net etching operation typically removes less than about 600 Å, and in some cases less than about 300 Å, e.g., about 100-200 Å of material from the bottom portion of the recessed feature.

The depositing and etching operations in the profiling cycles can be performed using PVD deposition and resputter etch-back. In some embodiments it is preferred that resputter etch-back does not include a significant deposition component, e.g., resputtering with an etch rate to deposition rate (E/D) ratio of at least about 2 in the bottom of the recessed feature is preferred in some of the embodiments.

Typically, the profiling cycles are performed in one process chamber. The layer of diffusion barrier material deposited prior to profiling cycles can be formed using a variety of methods including PVD, CVD, ALD and PDL. In one embodiment this layer is deposited using PVD, and the profiling cycles are performed in the same PVD chamber. A variety of PVD chambers, such as chambers equipped with planar and three-dimensional targets can be used. For example provided methods can be practiced in planar magnetrons and in a hollow cathode magnetron (HCM).

In some embodiments, the profiling cycles are used for forming an anchor recess at the bottom of a via in a dual Damascene structure. In this embodiment, profiling cycles are used to etch out typically between about 10-600 Å of metal from a metal line underlying a via. In some embodiments a layer of dielectric is being exposed at a higher-lying recess (e.g., a trench) while metal-containing material is being removed from the bottom of the lower-lying recess (e.g., a via). When material removal is performed using profiling cycles described herein, about 10-600 Å of material can be removed from the bottom portion of a lower-lying recess without substantially damaging an exposed dielectric on the semiconductor substrate. For example low-k and ultra low-k dielectrics, such as porous dielectrics, carbon-doped silicon dioxide (CDO), fluorine-doped silicon dioxide, organic-containing dielectric materials, can be exposed to resputtering plasma, such that microtrenches are not formed in a dielectric.

The profiling cycles can be performed on a variety of metal-containing materials. In one embodiment a layer of $TaN_x$ is first deposited, followed by a plurality of profiling cycles which include depositing tantalum in the net depositing operation. In another embodiment, the plurality of profiling cycles include depositing $TaN_x$ in the net depositing operation. In yet another embodiment, a first diffusion barrier material (e.g., TaNx) is deposited and is then subjected to the profiling cycles which include depositing the first barrier material (e.g., $TaN_x$) in the net depositing operation. Then, a layer of second diffusion barrier material is deposited (e.g., Ta), and a plurality of profiling cycles which include depositing second diffusion barrier material (e.g., Ta) are performed.

In one embodiment, a layer of diffusion barrier material is deposited on at least a bottom portion of a recessed feature, then resputtering is performed at the bottom of the recessed feature (with or without atomic layer profiling), and a flash layer of diffusion barrier material is deposited on at least the recessed feature bottom. An etch-back of the flash layer can be then performed using profiling cycles if needed.

In other embodiments, provided methods are applied to resputtering of copper seed layers. Resputtering of copper seed layers is often performed to improve sidewall coverage of recessed features and to reduce overhang at the recessed feature openings. Performing resputtering in a series of profiling cycles achieves improved shaping of the feature bottom, and improved overhang reshaping.

Further, resputtering in a series of profiling cycles achieves more rounded feature bottoms, leading to improved coverage in this region. In particular, material coverage in the bottom corners of recessed features can be significantly improved. For example, at least about 5 Å diffusion barrier or seed layer coverage can be obtained at the bottom corners of the recessed features with the use of provided methods.

Another aspect of this invention pertains to an apparatus for processing material on a semiconductor wafer having recessed features. The apparatus includes a process chamber equipped with a target for sputtering material onto the semiconductor wafer, a wafer support for holding the wafer in position during material processing and a controller including instructions for performing a plurality of profiling cycles. The apparatus may include for, example a planar magnetron or an HCM, and can be configured for depositing, e.g., $TaN_x$, Ta, and Cu.

These and other features and advantages of the present invention will be described in more detail below with reference to the associated drawings.

DETAILED DESCRIPTION OF PREFERRED EMBODIMENTS

Plasma etch-back (resputtering) of metal-containing materials on a wafer is performed using a plurality of atomic layer profiling (ALP) cycles. Each cycle includes a net etch operation and a net deposition operation. Small amounts of material are etched and deposited in each operation, resulting in a net etch-back which could be performed incrementally, often with an atomic scale control. Several benefits can be achieved with the use of this method. First, it was discovered that plasma etching that employs alternating etching and depositing operations can be used to remove metal-containing materials from the wafer surface in the presence of an exposed dielectric without causing microtrenching in a dielectric. Further, it was noted that improved overhang clipping can be achieved with this method compared to a one-step resputtering. Also, profiling cycles described herein can be used to improve the shapes of recessed features, making them more rounded at the bottom. Provided methods can also be used to improve material coverage at the bottom corners of the recessed features. As a result, integrated circuit devices having improved reliability are fabricated.

Atomic layer profiling methods can be integrated into the process flows for deposition of diffusion barrier materials and seed layer materials to replace previously used one-step resputtering. ALP methods can be used to remove material from a via bottom in a dual Damascene anchoring process, to redistribute material within a recessed feature (e.g., from a feature bottom to a feature sidewall), and to remove excess material from overhangs at the recessed feature openings.

In order to frame the context of this invention, a brief description of a copper dual Damascene process for forming a partially fabricated integrated circuit is described below. The presented methods are not limited to a dual Damascene process and can be used in other processing methods, e.g., in single Damascene processing. While provided methods are particularly advantageous for processing substrates having narrow recessed features with widths of about 65 nm and less (e.g., about 45 nm), they can be equally applied to processing of substrates having wider recesses.

Figure 1A:
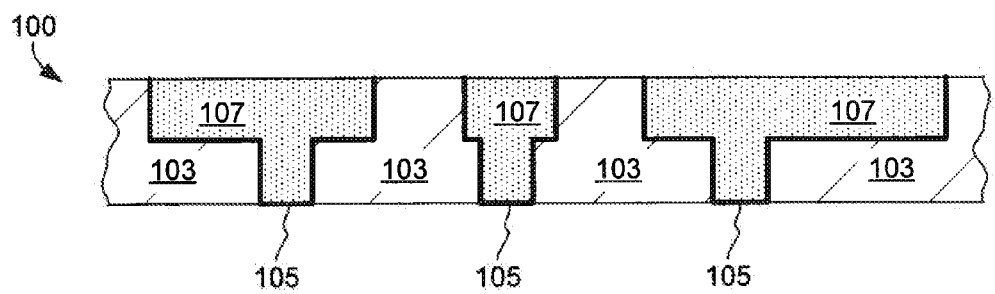
FIGS. 1A-1H show cross sectional depictions of device structures created during a copper dual Damascene fabrication process.

Presented in FIGS. 1A-1G, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. The substrate 100 may reside on a layer carrying active devices, such as transistors. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by copper seed layer deposition and an inlay with copper conductive routes 107. Because copper or other mobile conductive material provides the conductive paths of the semiconductor wafer, the underlying silicon devices must be protected from metal ions (e.g., $Cu^{2\pm}$) that might otherwise diffuse or drift into the silicon. Suitable materials for diffusion barrier 105 include tantalum, tantalum nitride, and the like. In a typical process, barrier 105 is formed by a physical vapor deposition (PVD) process such as sputtering, a chemical vapor deposition (CVD) process, or an atomic layer deposition (ALD) process. ALP methods described herein can be used to perform resputtering integrated into the deposition process of layer 105, if needed.

Typical metals for the conductive routes are aluminum and copper. More frequently, copper serves as the metal in Damascene processes, as depicted in these figures. The metal lines 107 are typically deposited by electrofill methods onto a thin layer of pre-deposited seed layer (not shown). The seed layer is usually deposited by PVD and can be formed, in some embodiments, using ALP methods described herein.

After fill of metal layer 107 (above the field) the excess metal is removed to the field level (as well as portions of diffusion barrier 105 on the field). This leaves metal inlay 107 exposed on the field region for construction of additional layers. The resultant partially fabricated integrated circuit 100 is a representative substrate for subsequent Damascene processing, as depicted in FIGS. 1B-1G.

Figure 1B:
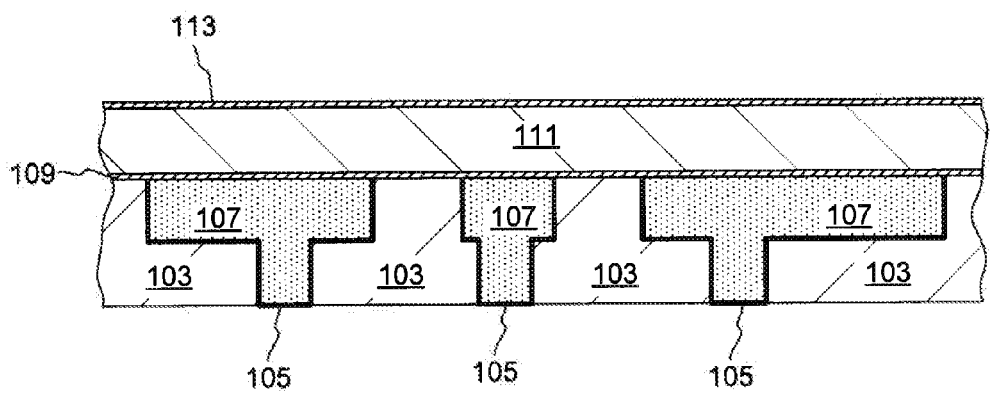

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. The dielectric 111 is typically a low-k dielectric, such as described above for the layer 103. This is followed by deposition of an etch-stop layer 113 (typically composed of silicon nitride or silicon carbide) on the first dielectric layer 111. Layers 109, 111, and 113 can be deposited by CVD and plasma enhanced CVD (PECVD) methods from a variety of silicon, oxygen, carbon, and nitrogen containing precursors.

Figure 1C:
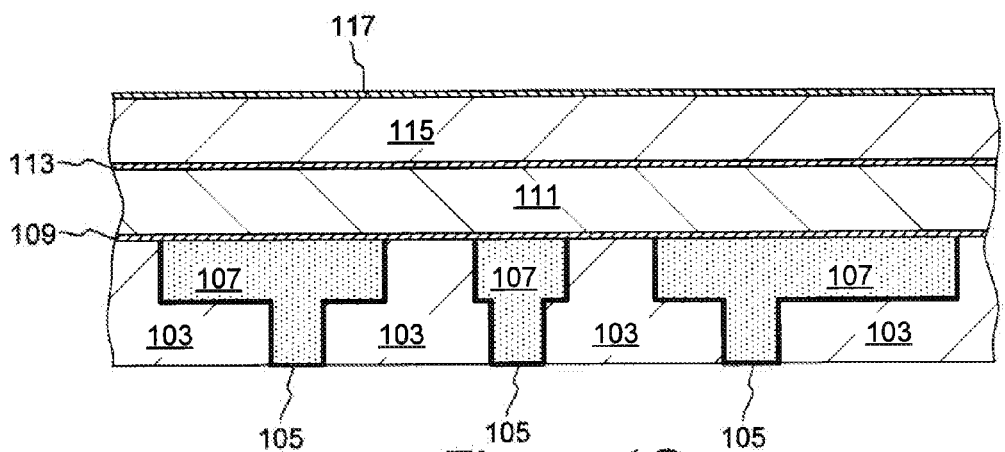

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically containing BARC materials, follows.

Figure 1D:
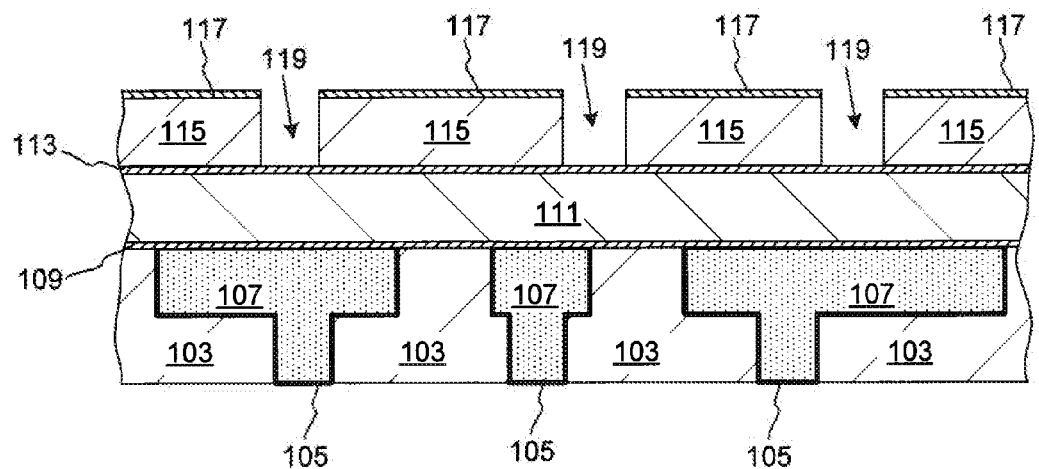
Figure 1E:
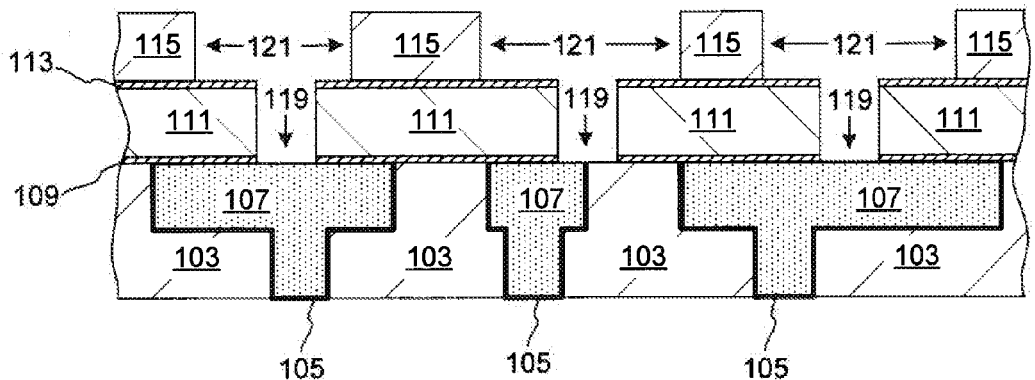

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
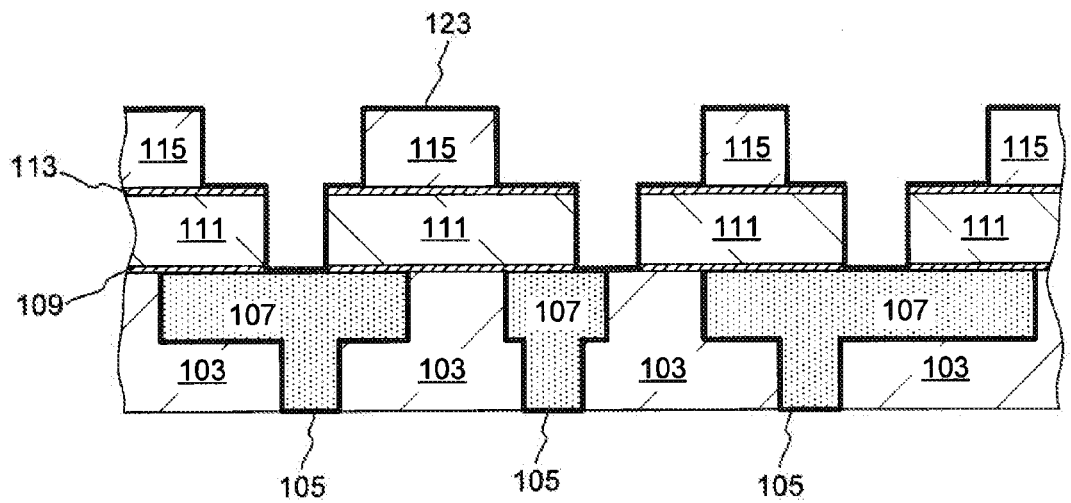

Next, as depicted in FIG. 1F, these newly formed vias and trenches are coated with a diffusion barrier 123. The barrier 123 is made of tantalum, or other materials that effectively block diffusion of copper atoms into the dielectric layers. The methods provided herein can be integrated into deposition process flows for a diffusion barrier 123. Example deposition process flows that can make use of the methods provided herein are described in detail in U.S. Pat. No. 6,607,971, issued Aug. 19, 2003 naming Rozbicki et al as inventors, U.S. Pat. No. 6,764,940, issued Jul. 4, 2004 naming Rozbicki et al. as inventors, U.S. Pat. No. 7,186,648, issued Mar. 6, 2007 naming Rozbicki et al. as inventors, and in U.S. patent application Ser. No. 11/588,586, filed Oct. 26, 2006 naming Kailasam et al as inventors. U.S. Pat. Nos. 6,607,971, 6,764,940, 7,186,648, and the U.S. patent application Ser. No. 11/588,586 are herein incorporated by reference in their entireties and for all purposes.

An anchoring process that involves removing a portion of metal from underlying metal lines 107 in conjunction with barrier layer deposition is often performed to increase the reliability of formed interconnects. This process will be described in detail in the following sections.

After the diffusion barrier 123 is formed, a seed layer 125 is deposited on top of the diffusion barrier layer (by a PVD, CVD or an ALD process) to enable subsequent electrofilling of the features.

Figure 1G:
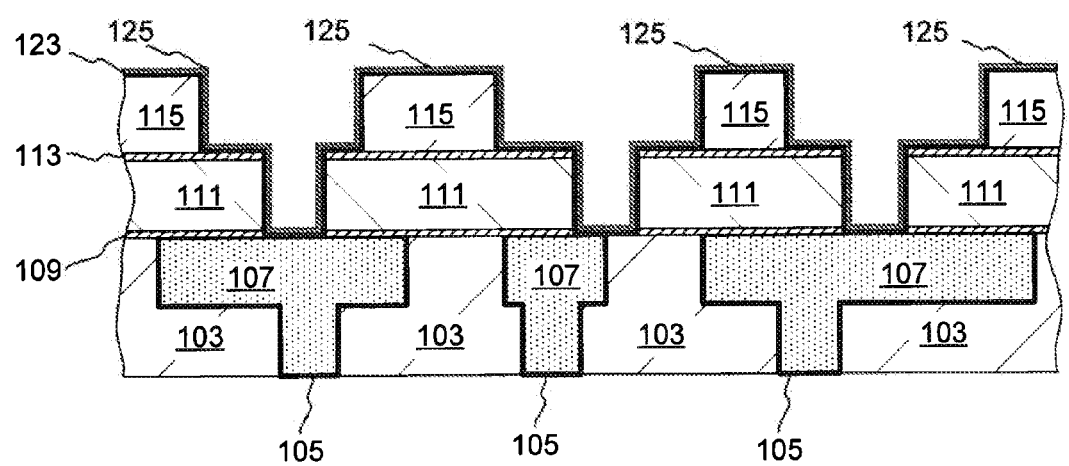
Figure 1H:
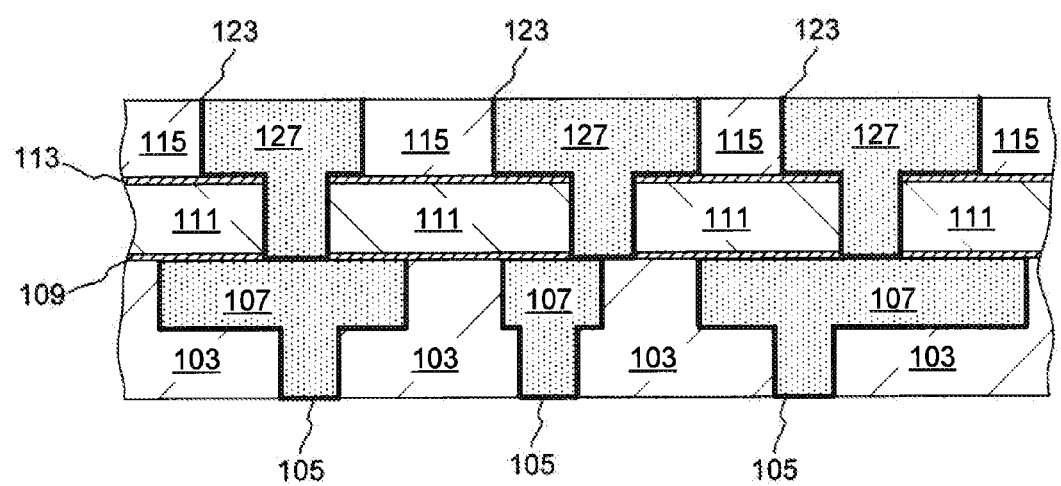

FIG. 1G depicts a copper seed layer 125 deposited on top of the diffusion barrier layer 123. The seed layer should preferably be continuous and should conformally coat the recessed features in order to support an electrofill process. Some process flows for depositing copper seed layers include plasma etch-back operations designed to achieve conformal seed layer coverage within the features. In such processes, ALP methods described herein can be used to effect material etch-back and redistribution. An example process flow that includes resputtering in a copper seed deposition context is described in the U.S. patent application Ser. No. 11/701,984 filed Feb. 1, 2007 naming Rozbicki et al. as inventors.

After the seed layer has been deposited, the recesses are electrofilled with copper. During electrodeposition of copper, the seed layer residing on the wafer serves as a cathode with an electrical contact being made at the edge of the wafer. After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over barrier 123.

Copper routes 127 and 107 are now in electrical contact and form conductive pathways, as they are separated only by diffusion barrier 123, which is also somewhat conductive.

The methods provided herein can be used for resputtering metal-containing materials in a variety of structures. For example, barrier material 105 residing at the contact vias can be resputtered using provided ALP methods. Barrier material 123 coating the landed and unlanded vias in the dual Damascene region can also be resputtered using ALP cycles. Provided methods are particularly advantageous for performing anchoring in dual Damascene structures, since anchoring process often inadvertently exposes dielectric layers to resputtering plasma.

A brief overview of PVD and resputter will now be provided.

During deposition in a plasma PVD apparatus, the wafer substrate is placed into the process chamber, which is configured for plasma generation. The process chamber includes a metal target which accepts a negative DC bias and serves as a source of metal flux during deposition, a wafer pedestal which holds the wafer in position during material processing and which also provides temperature control of the wafer, an inlet for introduction of an inert gas, and one or several magnets for confining the plasma in the proximity of the target. A RF bias can be optionally applied to the wafer. When net deposition of material is desired, typically no bias or only a small bias is applied to the wafer. After the wafer substrate is secured on the wafer pedestal, and the inert gas (e.g., argon) is introduced into the chamber, the plasma is ignited by applying a DC power to the target and confining the plasma with the use of magnetic field in the proximity of the target. Argon is positively ionized in a plasma to form $Ar^+$ ions which impinge on a negatively charged target with a sufficient momentum to dislodge metal atoms from the target. The neutral metal atoms dislodged from the target can be further ionized in a plasma. The metal species including neutral and ionized metal are being sputtered from the target onto the wafer and deposit on its surface.

When larger RF bias is applied to the wafer, the positively charged argon ions and metal ions may acquire sufficient energy at the wafer surface to impinge upon the wafer with a sufficient momentum to dislodge material from the wafer surface causing etching (resputter). Atoms of the etched material may be permanently removed from the wafer, or may be redistributed from one position on the wafer to a different position. For example, material may be redistributed from the bottom of the via to the via sidewalls. Typically, etching and depositing processes are occurring simultaneously in the PVD chamber. Etching is effected by the inert gas ions and, in some cases, by metal ions, impinging on the wafer with a sufficient momentum to dislodge the exposed material, while deposition is effected by neutral metal atoms and, in some cases, by metal ions, being sputtered onto the wafer from the target. When an intrinsic etch rate E is greater than the intrinsic deposition rate D, a net etching process is occurring on the wafer surface. When the etch rate E is smaller than the deposition rate D, the process is characterized as a net deposition.

An etch rate to deposition rate ratio is often used to characterize the resputtering and deposition processes. At the E/D ratio of 1, no net deposition or etching is occurring. At the E/D ratio of 0, the process is entirely depositing. At E/D ratios of greater than 1 etching predominates, this being characteristic of resputter. The E/D ratio is not necessarily the same in different features of the wafer. For example, the E/D ratio in the field, in the trench, and in the via may have different values. For example, it is possible to have net deposition in the field region (E/D<1) and net etch at the via bottom (E/D>1). The resputtering process can be described as a process that provides an E/D>1 at least at one location on the wafer, e.g., at a via bottom, at the lowest lying feature on the wafer or in some cases in the feature having the highest aspect ratio. The fact that a net deposition is occurring at a different location on the wafer, e.g., in the field, does not change the fact that resputtering is performed. An E/D ratio can be modulated by modulating the process parameters, such as the DC power applied to the target and the RF power applied to the wafer. The intrinsic deposition rate D is typically increased as the DC power to the target increases, because larger amounts of metal species are being sputtered from the target. An intrinsic etch rate E is typically increased as the RF power at the wafer increases, since it results in higher energy of inert gas ions and/or metal ions impinging on the wafer. Therefore E/D ratio can be increased by increasing the RF(wafer)/DC(target) power ratio.

As described net etching and net deposition can be performed in one process chamber and can be controlled by process parameters such as power levels applied to the wafer and the target, pressure in the process chamber, strength of magnetic fields, etc.

For the etchback (resputter) step the combination of DC power applied to the target and RF power applied to the wafer has to ensure the net material removal from the wafer. For example, for HCM modules having target areas of between about 1000-6000 cm$^2$, DC power should be in the range from 1 kW to 10 kW or as low as 0 for the pure etching. One of skill in the art will understand that this range depends on the target area, and can be different for smaller or bigger targets especially if the method is used with the different source/target design. The RF power may be between about 100 W to 3000 W for a typical substrate (e.g., a 300 mm wafer). This range depends on the wafer area and can be much greater for applications that deal with big substrates. In terms of power density (independent of the target area or substrate area), examples of suitable DC power ranges for the sputter etch operation are range from about 0 W/(cm$^2$ target) to 5 W/(cm$^2$ target) and for the RF power, from about 0.1 W/(cm$^2$ substrate) to 5 W/(cm$^2$ substrate).

For the net deposition process the DC power can range from about 5 W/(cm$^2$ target) to 25 W/(cm$^2$ target), and, for the RF power, from about 0 W/(cm$^2$ substrate) to 0.5 W/(cm$^2$ substrate). PVD deposition is described in U.S. Pat. Nos. 6,905,959; 6,773,571; and 6,642,146, which patents are hereby incorporated by reference and for all purposes.

FIGS. 2A-2D illustrate problems associated with an anchoring process performed using a one-step resputtering. These problems include dielectric microtrenching and inadequate diffusion barrier coating at the bottom corners of an anchor recess.

Figure 2A:
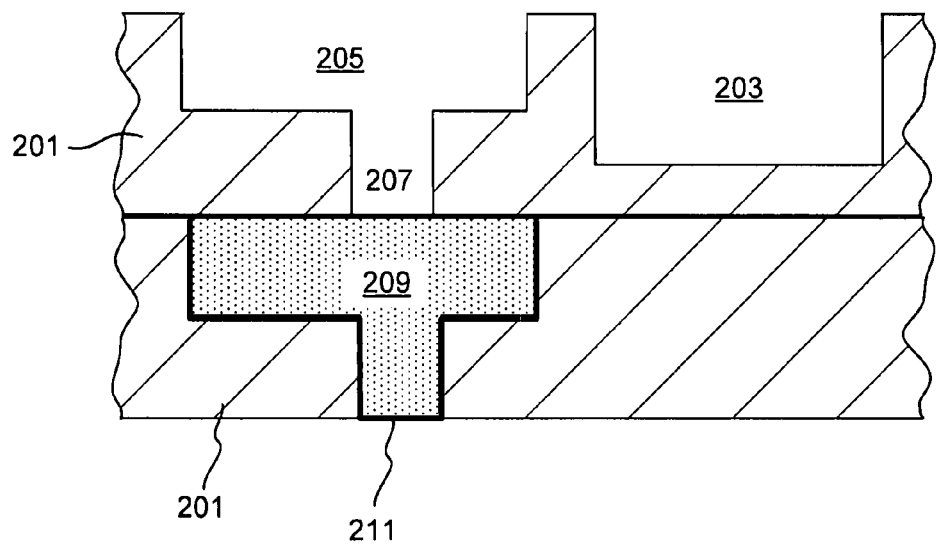
FIGS. 2A-2D show cross sectional depictions of device structures obtained during anchoring in a dual Damascene process. Microtrenching in a dielectric is illustrated.

It is often desirable to use resputter for etching through the via into the underlying copper line. The sequence of wafer processing steps resulting in such punch-through etching is depicted in FIGS. 2A-2D. Referring to FIG. 2A, a cross-sectional depiction of a wafer substrate is shown. The substrate comprises two layers of dielectric 201, where the top layer is patterned with three recesses, a lower-lying trench 203, a higher-lying trench 205 and a via 207. The lower-lying trench 203 is also a higher aspect ratio trench. The dielectric 201 may be a low-k dielectric such as carbon doped silicon dioxide, hydrogenated silicon oxycarbide (SiCOH), fluorine doped silicon dioxide, or organic-containing low-k dielectric. A conductive line 209 resides in the underlying dielectric layer directly below the via 207. Conductive lines are most commonly copper lines. The sides and the bottom of the copper line are coated with a diffusion barrier layer 211, which prevents the diffusion of copper into the dielectric layer 201. Etch-stop and antireflective layers, such as 113 and 117 of FIG. 1C, are not shown for clarity reasons.

Figure 2B:
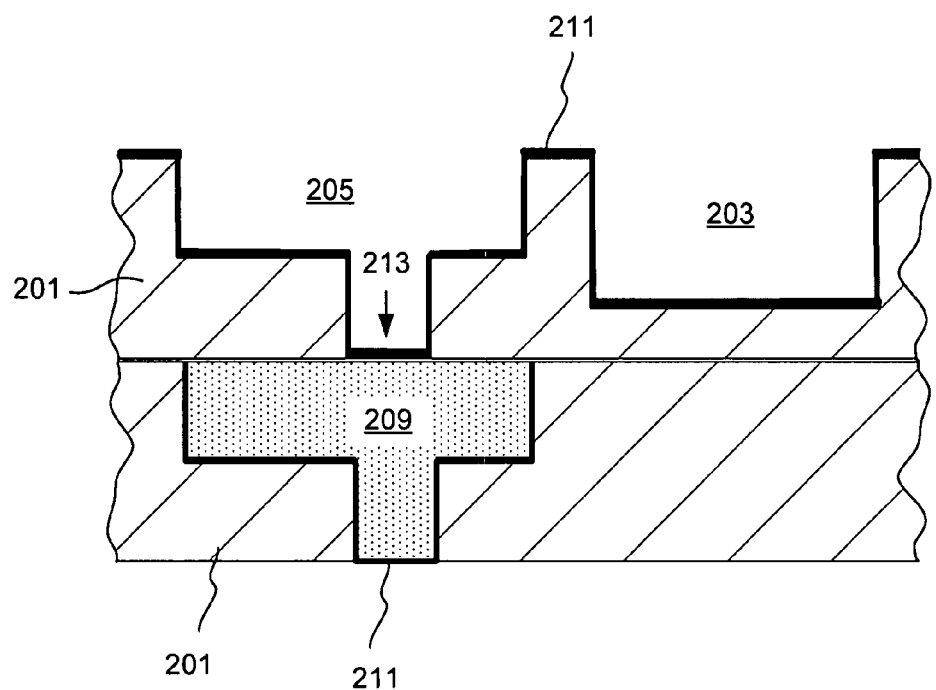

The exposed top dielectric layer is then subjected to a diffusion barrier deposition step resulting in the structure shown in FIG. 2B. It can be seen that after the deposition step, diffusion barrier layer 211 covers the surface of top dielectric layer both in the field and in the recesses. The uniformity of such coverage, however, is low, particularly in the via region. There is significant accumulation of the barrier material in the via bottom 213, and a very thin coverage of the via sidewalls. Uniformity of the via coverage is improved through the resputter step in which material residing at the via bottom is resputtered onto the via sidewalls.

When resputtering is performed further, it etches material of the copper line 209 residing below the via leading to formation of a cavity in the conductive line, known as an anchor recess. In a conventional process about 50 Å of tantalum and up to about 500 Å of copper were etched in a single resputtering step.

Figure 2C:
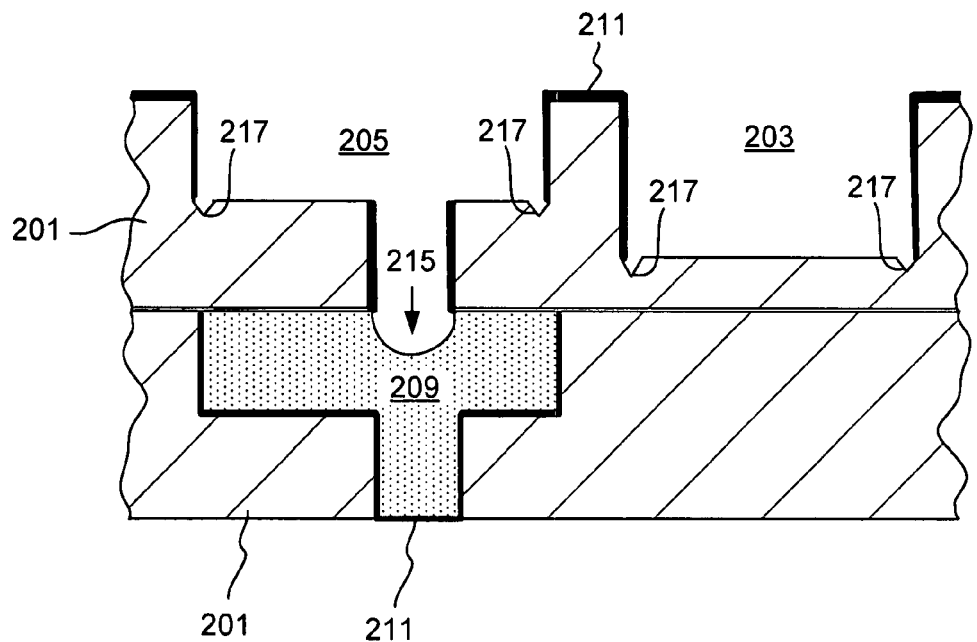

The structure with an anchor 215 is shown in FIG. 2C. The anchor is a desired feature in the fabrication of an IC device since it would result in a mechanically strong interconnect when the via is filled with metal. At the same time, resputtering leads to undesired and unintentional changes in the trench region. The bottom of the trench is stripped of the barrier layer, and the dielectric becomes exposed to the impact of high-energy ions. In particular, dielectric layer in lower-lying trenches, such as in the trench 203 becomes easily exposed, because little etching selectivity exists between a via 207 and lower-lying trench 203.

Further resputtering of an exposed dielectric in the trench, especially in a high E/D mode leads to a microtrenching problem. Microtrenches 217 are formed at particular spots in the dielectric layer of the trench bottoms, usually in the proximity of the sidewalls. It is believed that reflection of high-energy ions from the trench sidewalls onto particular locations of dielectric in the trench bottom causes increased bombardment of dielectric in these particular sites. The impact of resputtering is, therefore, increased in these spots leading to higher localized etching and formation of microtrenches. This effect is especially pronounced for low-k dielectric, since they are often brittle and easily damaged materials. Microtrenching in silicon dioxide dielectric usually does not occur as readily. Microtrenches can form at any point during the resputtering process when dielectric becomes exposed to argon and/or metal ions. Depending on the relative thickness of the barrier layer in the trench and in the via bottom, the trench bottom dielectric can become exposed in the beginning or at the end of barrier layer resputtering in the via or during the etch-back of copper line during anchor formation.

Microtrenches are viewed as undesired features in IC devices since they contribute to level-to-level current leakage, result in poor adhesion of subsequently deposited layers and lead to decreased reliability of the integrated circuit.

Figure 2D:
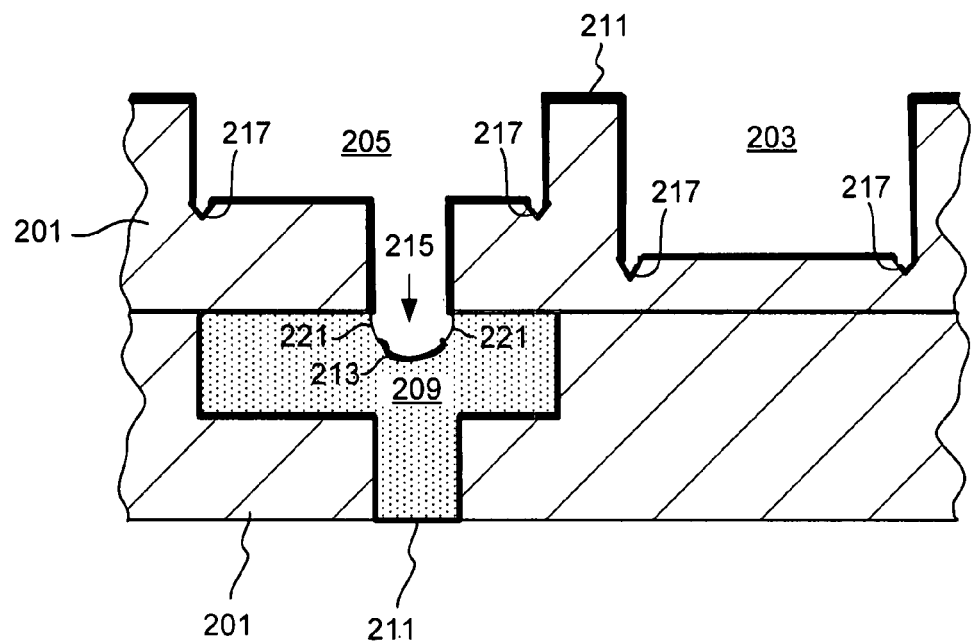

Referring to FIG. 2D, after formation of an anchor recess 215, a flash layer 213 of diffusion barrier material, such as Ta, is deposited on at least the horizontal surfaces of the substrate, e.g., on the trench bottoms, and on the anchor bottom. It was noted, however, that spots having weak or no barrier coverage 221 would form at the bottom corners of an anchor recess. After the vias and trenches are electrofilled with copper, and the complete device is fabricated, these weak spots could lead to electromigration failure in this region.

Both microtrenching and inadequate barrier material coverage in the anchor corners can be eliminated by splitting the single-step resputtering into a plurality of ALP profiling cycles, each cycle having a net deposition operation and a net etch operation. For example, instead of removing 250 Å of copper in a single resputtering operation, the process might include the following sequence: (20 Å Ta deposition-70 Å etch-back)×5 at the feature bottom.

Figure 3A:
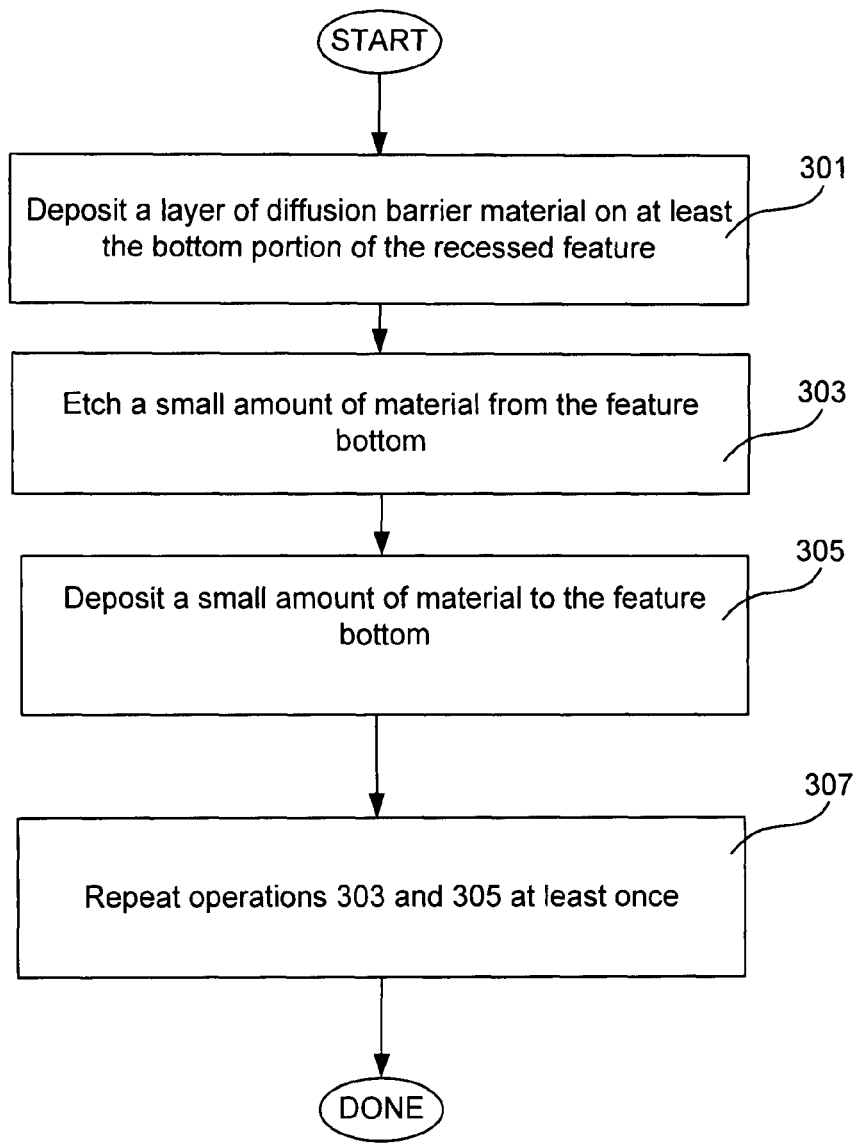
FIGS. 3A-3B present process flow diagrams in accordance with embodiments described herein.

An example process flow diagram for an ALP method is shown in FIG. 3A. The process starts by depositing a layer of diffusion barrier material on at least the bottom portion of the recessed feature in an operation 301. Example diffusion barrier materials that can be deposited include Ta, TaN$_x$, Ti, TiN$_x$, W, WN$_x$, Ru, Co and the like. In general these materials can be deposited by a variety of methods including PVD, ALD, CVD and PDL. In one implementation, the diffusion barrier material is deposited in a PVD process chamber, and the same process chamber is used for the following ALP cycles. The first ALP cycle starts by etching a small amount of material from the recess bottom by resputter in an operation 303. Preferably, less than about 200 Å, more preferably less than about 100 Å, e.g., between about 5-50 Å of material is removed from the recess bottom by operation 303. Operation 303 may remove a portion of material deposited in 301, all of this material, or all of this material and a small portion of an underlying copper line material. Next, a small amount of material is deposited into the feature bottom in an operation 305. The amount of material deposited in an operation 305 is smaller than the amount of material etched in an operation 303, such that net etching is achieved in at least one, and preferably in all of the profiling cycles. In one embodiment, between about 5-20 Å of material (typically of a diffusion barrier material sputtered from the target in a PVD process) is deposited at the recessed feature bottom. While in many embodiments it is preferred that net deposition of material occurs in this operation, in other embodiments E/D of about 1 can be achieved at the feature bottom in this step, with material being simultaneously deposited and sputter etched at almost equal rates. One profiling cycle includes operations 303 and 305 and typically achieves removal of between about 5-100 Å, preferably of between about 10-50 Å of material per cycle. Next, a second profiling cycle which includes a net etch and a net deposition operation is performed. Thus the cycles are repeated as shown in 307, until the necessary amount of material is removed from the recessed feature bottom. Note that etch and deposition operations need not necessarily be identical for all of the profiling cycles, and a variation in the amount of etched and deposited material can exist within the guidelines described above. Typically, about 2-10 profiling cycles are sufficient for most purposes. For example a 500 Å deep anchor can be formed by performing 10 profiling cycles, each removing about 50 Å of material (typically a mixture of Ta and Cu) from the bottom of the via in a dual Damascene structure.

Figure 3B:
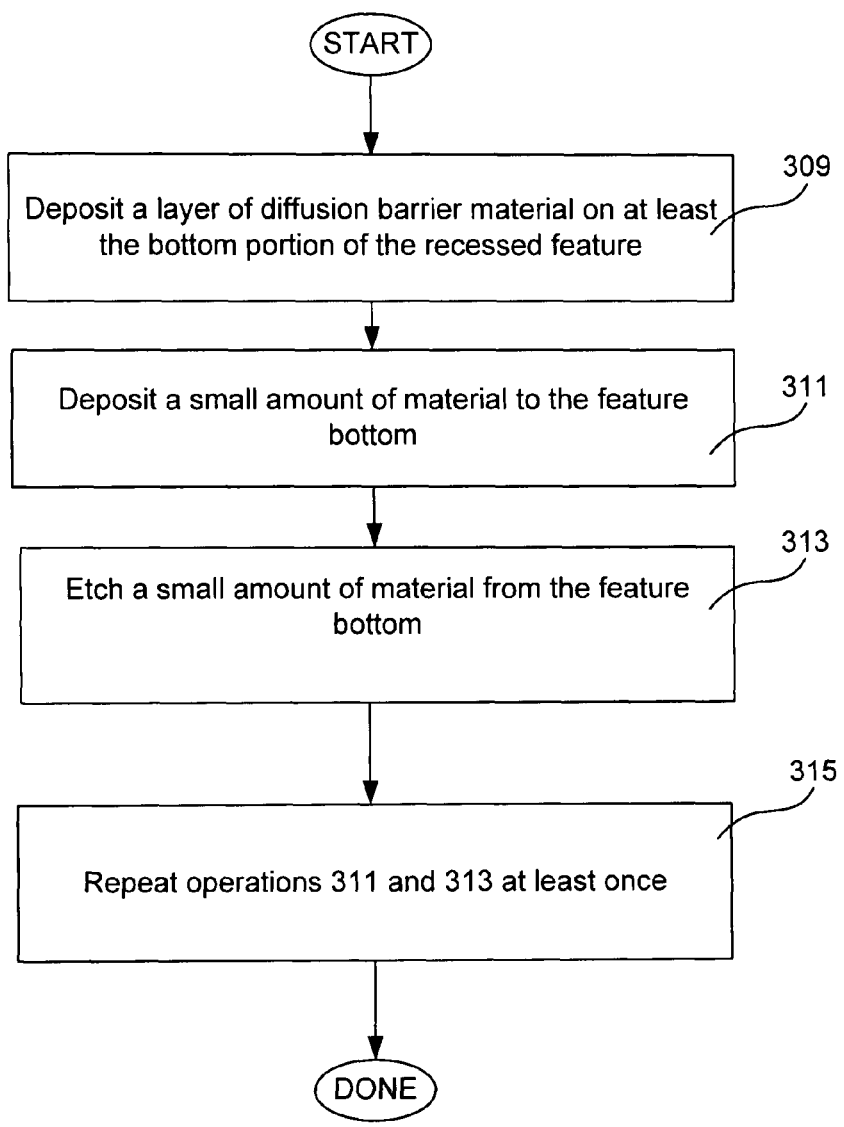

While ALP cycles typically include alternating net depositing and net etching operations, they do not necessarily need to start with an etching operation and end with a depositing operation, as shown in FIG. 3A. FIG. 3B shows a process flow diagram according to another embodiment in which the first ALP cycle starts with a net deposition operation. Referring to FIG. 3B, the process starts by depositing a layer of diffusion barrier material on at least the bottom portion of the recessed feature in 309 (analogously to operation 301 of FIG. 3A). For example a layer of $TaN_x$ is deposited by PVD. Next, the first ALP cycle starts by depositing a small amount of material on at least the bottom portion of the recessed feature in 311. For example, Ta can be deposited from the sputter target by PVD. Next, the deposited material and a portion of underlying metal-containing material (e.g., $TaN_x$) is etched away in an operation 313, thereby completing the first ALP cycle. Operations 311 and 313 are repeated at least once, as shown in 315, until a desired amount of material is removed from the recessed feature bottom. Depending on the requirements of the process, the ALP cycles may end either with a net depositing operation or with a net etching operation.

There is a wide latitude in tailoring the conditions for the etching and depositing operations of ALP cycles to achieve the desired atomic profiling result. In a particular embodiment tailored for an anchoring process, a net etching operation of an ALP cycle has an E/D ratio of greater than 1 both at the bottom of the lowest-lying recess (e.g., a via) and in the field region. Higher E/D ratios are typically preferable in the ALP embodiments designed for anchoring. For example, an E/D ratio of greater than about 2 at a recess bottom and greater than about 1.1 in the field is often preferred in this embodiment, for a net etching operation.

Further, it is often preferred that the net depositing operation of ALP cycles has an E/D ratio of less than 1 both in the field and at the recess bottom. While in some embodiments, the depositing operation used during anchoring may have an E/D ratio of greater than 1 at the via bottom that is being anchored, preferably an E/D ratio of less than 1 should exist at the bottom of the recessed feature having an exposed dielectric layer, e.g., a trench. In some embodiments, the net depositing operation of an ALP cycle deposits between about 5-50 Å, preferably about 10-30 Å of material in the field, and the net etching operation removes between about 5-80 Å of material from the field. Note that net etching rate is typically higher at the via bottoms than at the trench bottoms and is much higher at the via bottoms than in the field. Therefore, net etching of about 80 Å in the field may correspond to net etching of about 125 Å at the via bottom. The net deposition rate is typically higher in the field compared to via bottoms. Therefore, net deposition of about 400 Å in the field may correspond to about 200 Å deposition at the via bottom.

Figure 4A:
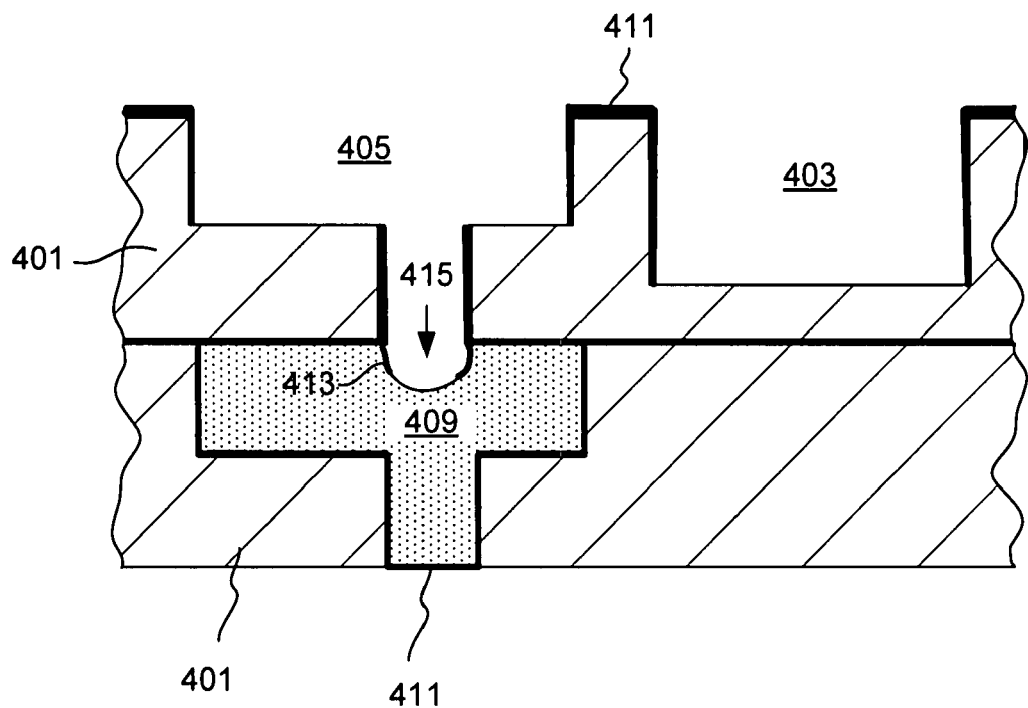
FIGS. 4A-4B show cross sectional depictions of device structures obtained during anchoring in a dual Damascene process with the use of atomic profiling methods described herein. Absence of microtrenching in a dielectric is illustrated.

When ALP cycles are used in an anchoring process or in any other etch-back which inadvertently exposes layers of dielectric, microtrenching of dielectric is significantly reduced. FIG. 4A shows a cross-sectional depiction of a device structure obtained after anchoring with ALP cycles. The features of the structure are numbered analogously to features shown in FIG. 2C. It can be seen that unlike in FIG. 2C, the microtrenches are absent from the bottoms of trenches 403 and 405.

Figure 4B:
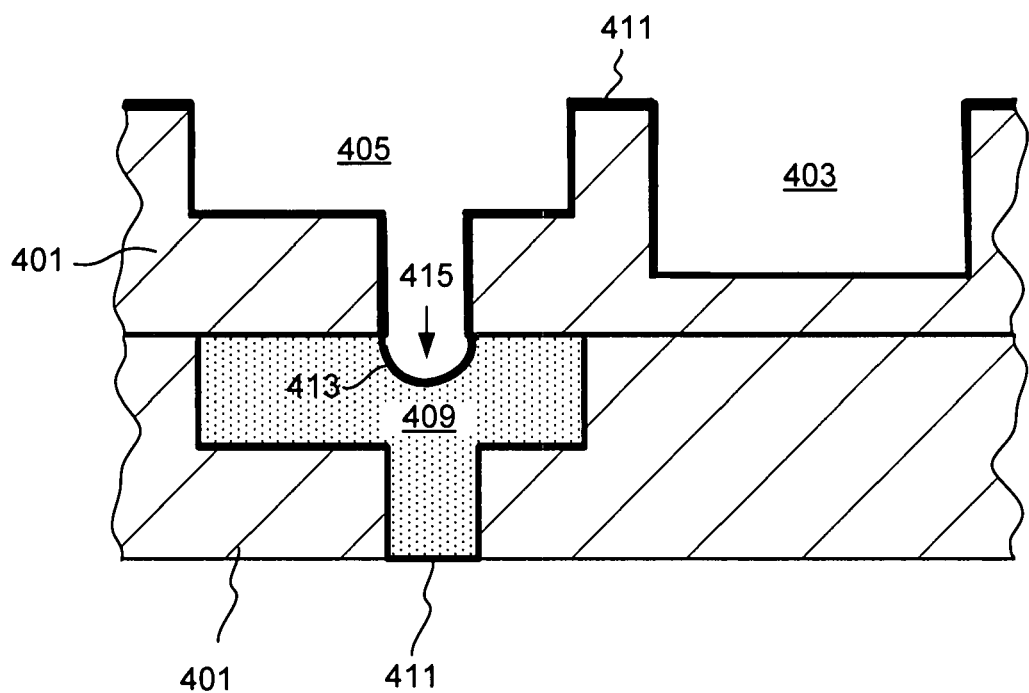

Further, diffusion barrier layer covers the sidewalls of an anchor 413, thereby eliminating the weak spots 221 seen in FIG. 2D. After the flash layer of diffusion barrier material is deposited, the structure depicted in FIG. 4B results. It can be seen that diffusion barrier layer 405 conformally covers the structure in the field and within the recesses including the trench bottoms and the anchor. Weak uncoated spots within the anchor are therefore reduced. At least about 5 Å of diffusion barrier material has been deposited at the weak spots in the corners of an anchor during ALP cycles.

In one example embodiment, such anchoring is performed by depositing about 100 Å of $TaN_x$ followed by five ALP cycles and a deposition of a flash layer of Ta (about 100 Å). Each ALP cycle first deposits about 20 Å of Ta followed by etching of about 50 Å of material, thereby resulting in a net removal of about 30 Å of material per ALP cycle. These values refer to the thicknesses measured in the field region.

While ALP was described in the context of anchoring as a particularly suitable method for performing anchoring in the presence of exposed dielectric, it is not limited to this application. In general, it can replace one-step resputtering in those cases where good material coverage is needed at the corners of recesses (both for diffusion barrier and for seed layer materials), where more rounded recess bottoms are desired, and where efficient overhang clipping is needed.

Figure 5A:
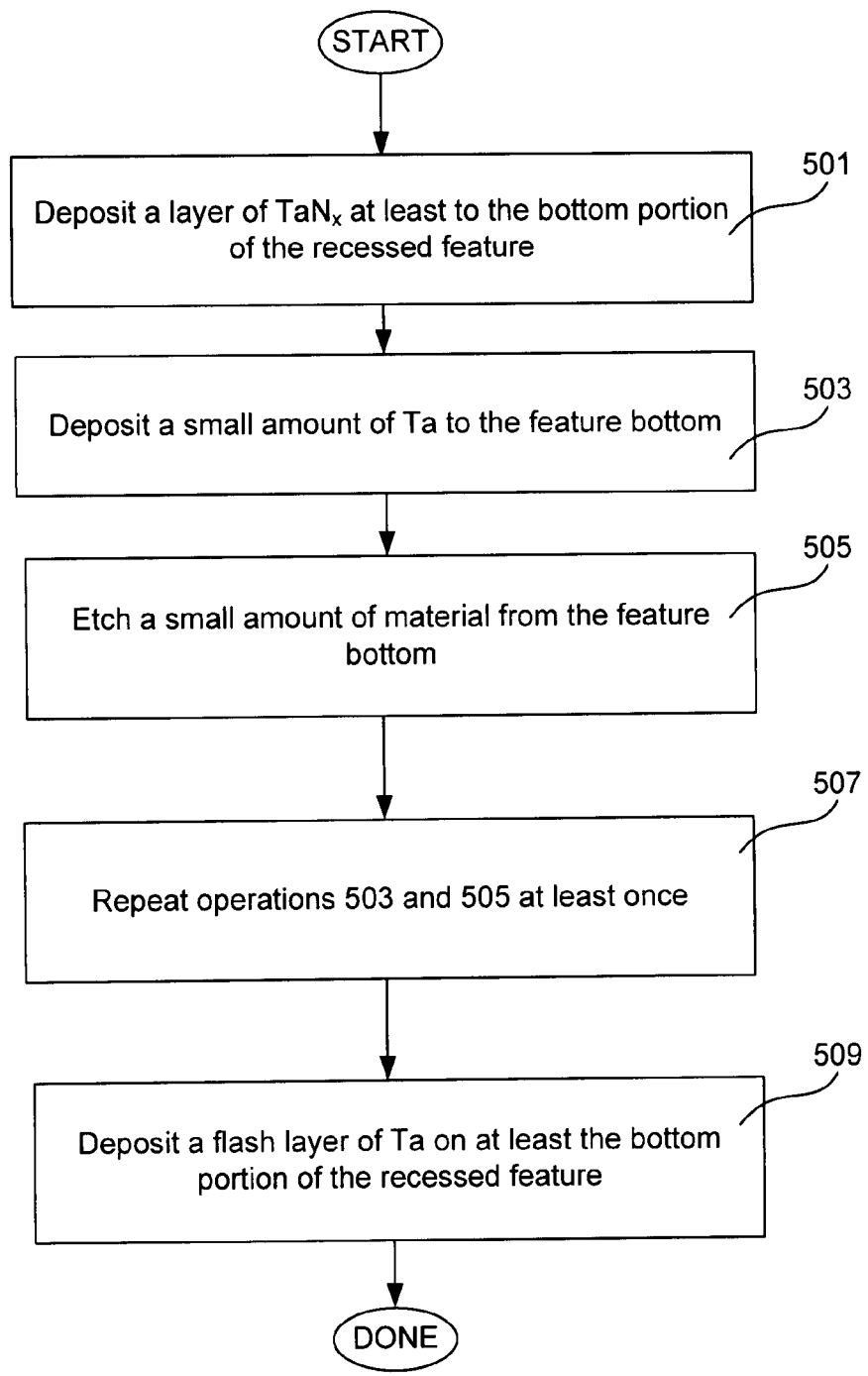
FIGS. 5A-5B present process flow diagrams in accordance with embodiments described herein.

FIG. 5A describes a specific embodiment that makes use of an ALP. The process illustrated in FIG. 5A starts by depositing a layer of $TaN_x$ at least on a bottom portion of a recessed feature in 501, e.g., in a tantalum PVD process chamber. The process follows by performing ALP cycles which include deposition of small amounts of tantalum, followed by short etch-back operations. The first profiling cycle deposits a small amount of tantalum at the recessed feature bottom from a tantalum sputter target in the same PVD chamber. The material is then etched from the feature bottom in an operation 505 completing the first ALP cycle. Then, next ALP cycle is performed by repeating tantalum deposition and etch-back. The ALP cycles are repeated until the necessary amount of material is removed or redistributed from the feature bottom. The flash layer of Ta is then deposited on the feature bottom in an operation 509.

ALP cycles can be performed, according to some embodiments, for $TaN_x$ etch-back, Ta etch-back, for anchoring, Ta flash layer etch-back and copper seed layer etch back.

Figure 5B:
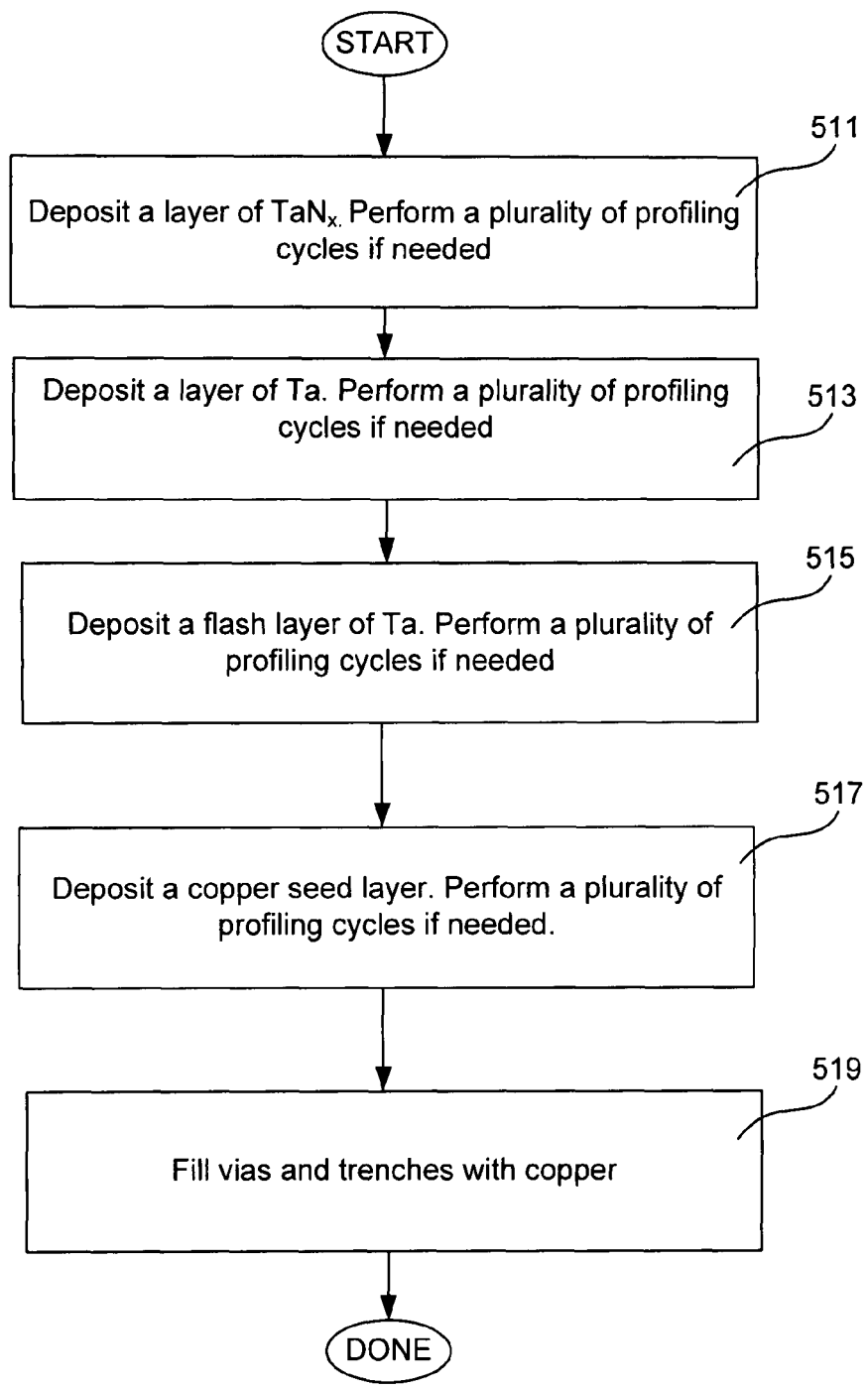

One example process flow diagram is shown in FIG. 5B. A substrate having recessed features is provided and a layer of $TaN_x$ is deposited in an operation 511. ALP etch-back can be performed on this layer by performing alternating resputtering and $TaN_x$ depositing operations as needed. Anchoring into an underlying copper layer may occur at this stage. Next, a layer of Ta can be deposited in an operation 513, and a plurality of ALP cycles can be performed if necessary. ALP cycles can include alternating Ta deposition from the sputter target and etching of material from the bottom of the recess. Anchoring into an underlying copper line can occur at this stage. Note that etch-back during anchoring when performed using ALP may include intermixing copper and tantalum-containing material on the sidewalls of recessed features, because mixtures of Ta and Cu are being sputtered onto the sidewalls. Such mixtures advantageously can serve as adhesion layers for subsequently deposited copper seed layers, leading to conformal deposition of copper seed layers. Such adhesion layers are described in detail in the commonly assigned U.S. patent application Ser. No. 11/807,178 titled "Methods and Apparatus for Engineering an Interface between a Diffusion Barrier Layer and a Seed layer" filed on May 28, 2007, which is herein incorporated by reference in its entirety and for all purposes. After an anchor recess is formed, a flash layer of Ta is deposited, and a plurality of profiling cycles is performed if needed in an operation 515. The substrate is then transferred from a diffusion barrier PVD chamber to a copper seed PVD chamber and a seed layer of copper (or copper alloy) is deposited on top of the diffusion barrier layer. If necessary a copper seed layer etch-back is performed using ALP cycles, as shown in 517. Copper ALP cycles involve alternating operations of depositing copper from the sputter target and etch-back operations. A flash layer of copper can then be deposited. After the seed layer has been deposited, the substrate can be transferred to an electrofill module, and copper can be deposited into the vias and trenches using electrodeposition.

The need for performing ALP cycles, and the number of ALP cycles for each particular operation shown in the process flow diagram of FIG. 5B, will be appreciated by one skilled in the art. For example, ALP cycles would almost always be desired if etch-back involves exposing dielectric materials to resputtering plasma. This can occur, for example, during operations 511 and 513. Further ALP cycles may be needed for overhang reshaping, e.g., in operations 515 and 517. Further, improved material coverage at the corners of recessed feature bottoms often becomes important during seed layer deposition and diffusion barrier deposition and rounded recess bottoms may be desired for this reason.

Example process conditions for operation 511 will be listed. The following conditions are suitable for TaNx deposition. DC target power can range from about 20-70 kW, preferably 20-30 kW, e.g., about 30 kW. RF wafer power can be in the range of about 0-1500 W, preferably 600-1200 W, e.g., about 800-1200 W. The pressure can range from about 0.5-3 mTorr. Argon can be supplied at a flow rate of about 5-100 sccm, preferably 10-50 sccm, e.g., about 20-40 sccm. Nitrogen can be supplied at a flow rate of between about 5-100 sccm, preferably 5-50 sccm, e.g., about 20-40 sccm.

The following conditions can be used for resputter. DC target power can range from about 1-10 kW, preferably 2-8 kW, e.g., about 4-8 kW. RF wafer power can be in the range of about 200-1500 W, preferably 400-1200 W, e.g., about 400-1000 W. The pressure can range from about 0.5-10 mTorr.

Example process conditions for Ta deposition in operation 513 can be the following. DC target power of about 20-70 kW, RF wafer power of about 0-1500 W, and pressure of about 0.1-3 mTorr can be used. In a particular embodiment, DC target power ranges from about 20-30 kW, RF wafer bias power is in the range of about 600-1200 W, and pressure is about 0.5-3 mTorr. In a specific example, a DC target power of about 30 kW, an RF wafer bias power of about 800-100 W, and a pressure of about 0.5-3 mTorr are used. Resputtering conditions in operation 513 can be the following. DC target power of about 1-10 kW, RF wafer power of about 200-1500 W, and pressure of about 0.5-100 mTorr can be used. In a particular embodiment, DC target power ranges from about 2-8 kW, RF wafer bias power is in the range of about 400-1200 W, and pressure is about 0.5-10 mTorr. In a specific example, a DC target power of about 4-8 kW, an RF wafer bias power of about 400-1000 W, and a pressure of about 0.5-3 mTorr are used.

Example process conditions for operation 515 include can be similar to conditions listed for operation 513.

Example process conditions for copper deposition in operation 517 can be the following. DC target power of about 300-110 kW, RF wafer power of about 0-2000 W, and pressure of about 0.05-5 mTorr can be used. In a particular embodiment, DC target power ranges from about 30-80 kW, RF wafer bias power is in the range of about 0-1200 W, and pressure is about 0.05-5 mTorr. In a specific example, a DC target power of about 60-80 kW, an RF wafer bias power of about 0-1000 W, and a pressure of about 0.05-5 mTorr are used. Resputtering conditions in operation 517 can be the following. DC target power of about 1-10 kW, RF wafer power of about 200-1500 W, and pressure of about 0.5-100 mTorr can be used. In a particular embodiment, DC target power ranges from about 2-8 kW, RF wafer bias power is in the range of about 400-1200 W and pressure is about 0.5-10 mTorr. In a specific example, a DC target power of about 4-8 kW, an RF wafer bias power of about 400-1000 W, and a pressure of about 0.5-3 mTorr are used.

A variety of ALP process flow can be used in barrier deposition. One example process flow involves depositing 80 Å of $TaN_x$, followed by three ALP cycles and a deposition of 70 Å of tantalum. ALP cycles include depositing 30 Å of Ta and etching 70 Å of material in each cycle. This process flow can be presented as a 80 Å TaN/(30-70 Å etchback)×3/70 Å Ta. These values refer to thicknesses measured in the field.

Another example process flow involves depositing 100 Å of $TaN_x$, followed by five ALP cycles and a deposition of 100 Å of tantalum. ALP cycles include depositing 20 Å of Ta and etching 50 Å of material in each cycle. This process flow can be presented as 100 Å $TaN_x$/(20-50 Å etchback)×5/100 Å Ta.

Another example process flow involves depositing 100 Å of $TaN_x$, followed by three ALP cycles and a deposition of 100 Å of tantalum. ALP cycles include depositing 35 Å of Ta and etching 70 Å of material in each cycle. This process flow can be presented as 100 Å $TaN_x$/(35-70 Å etchback)×3/100 Å Ta.

Another example process flow starts by performing 3 ALP cycles that involve depositing $TaN_x$. Each ALP cycle deposits 16 Å of $TaN_x$ and etches 4 Å of material. Next four Ta ALP cycles are performed. Each ALP cycle deposits 16 Å of Ta and etches about 25 Å of material. After ALP cycles are completed a 30 Å thick flash layer of Ta is deposited. This process flow can be presented as 100 Å $TaN_x$/(35-70 Å etchback)×3/100 Å Ta.

One skilled in the art will understand that many variations of ALP processes can be envisioned and practiced. The provided examples serve as illustrations and do not limit the scope of the invention.

A variety of PVD process chambers can be used for depositing and resputtering operations used in the provided methods. For example, PVD process chambers that include a hollow cathode magnetron or a planar magnetron can be used.

Hollow cathode magnetron is an apparatus carrying a three-dimensional sputter target. The resputtering and depositing operations described herein are not limited to a specific cup-like geometry of an HCM target and can be used in conjunction with three-dimensional and planar targets of a plurality of shapes. Further, in some embodiments, resputtering can be carried out in a plasma pre-clean chamber which typically does not include a sputter target and in a plasma enhanced ALD chamber.

Figure 6:
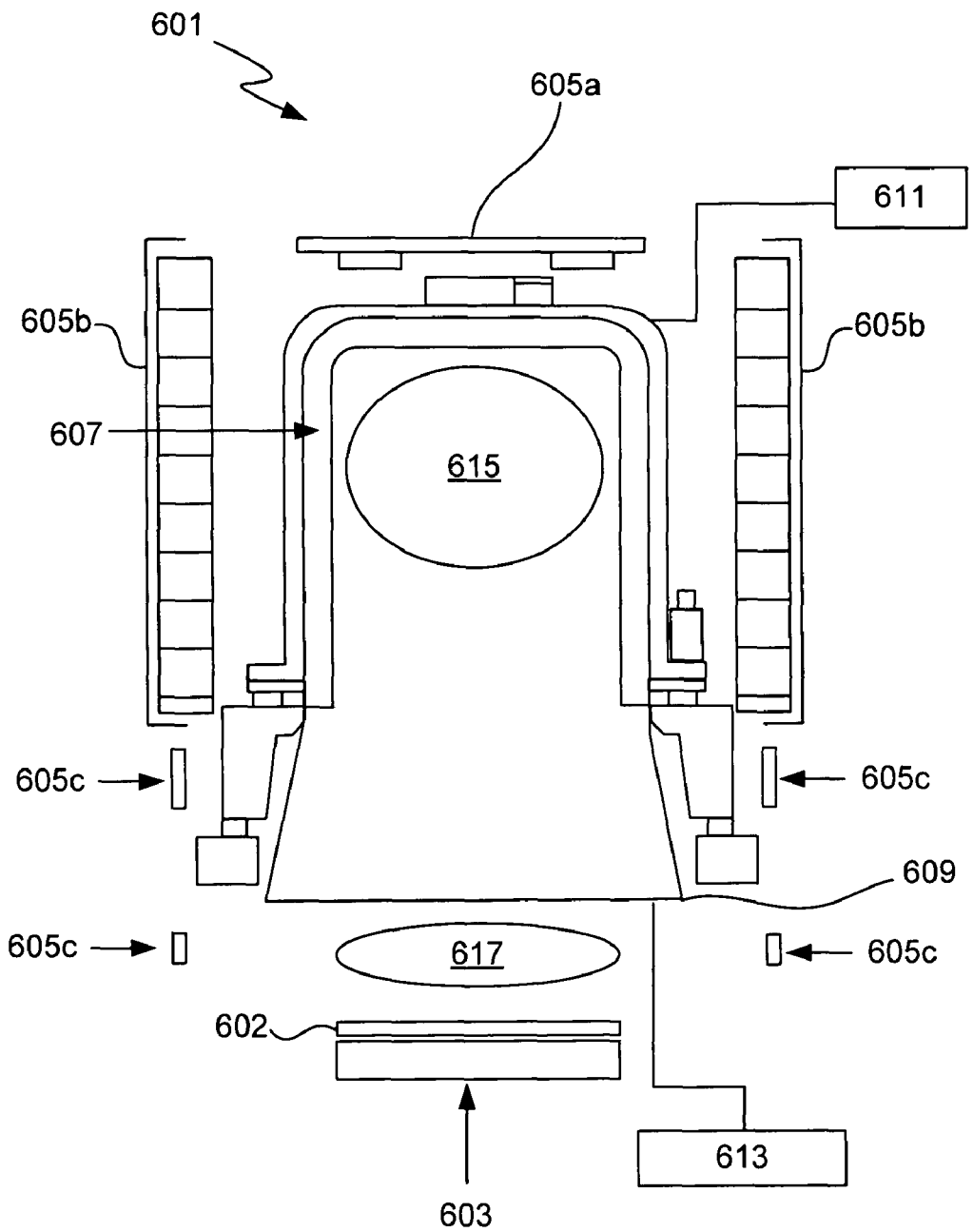
FIG. 6 is a cross sectional depiction of the hollow cathode magnetron (HCM) apparatus suitable for practicing methods described herein.

FIG. 6 presents a cross sectional view of one type of an HCM sputtering apparatus that can be used in accordance with the invention. The HCM apparatus has two main components, the source 601, in which a plasma is created and maintained, and the RF bias electrostatic chuck (ESC) pedestal 603, which secures the wafer 602 and applies an RF bias on the wafer, if needed. In this example, the source 601 contains a top rotating magnet 605a, several side electromagnets 605b-605c, circumferentially positioned around the process chamber, and a sputter target 607, operated at a negative DC bias. One or several shields may be positioned within the chamber next to the chamber sidewalls, to protect the sidewalls from the sputtered material. While the shield 609 is often referred as an anode, this shield operates at a floating potential and is not additionally electrically biased.

The cathode target 607 generally has a hollow cup-like shape so that plasma formed in the source can be concentrated within this hollow region. The cathode target 607 also serves as a sputter target and is, therefore, made of a metal material such as tantalum or copper, which is to be deposited onto a substrate.

An inert gas, such as argon, is introduced through a gas inlet into the hollow region of the cathode target 607 powered by a DC source to form a plasma. The pump 613 is positioned to evacuate or partially evacuate the process chamber. The control of pressure in the process chamber can be achieved by using a combination of gas flow rate adjustments and pumping speed adjustments, making use of, for example, a throttle valve or a baffle plate. The pressure used during deposition and resputter can range from between about 0.01 to about 100 mTorr. In some embodiments resputtering is performed at a higher pressure than deposition, e.g., deposition can be performed at pressures of less than about 1 mTorr, while resputtering can be performed in the pressure range of about 2-100 mTorr.

An intense magnetic field is produced by electromagnets 605a-605b within the cathode target region. Additional electromagnets 605c are arranged downstream of the cathode target so that different currents can be applied to each electromagnet, thereby producing an ion flux and a controlled deposition and/or etch rate and uniformity.

In one implementation, the polarity of the magnetic field generated by the electromagnetic coils 605b and by the downstream electromagnets 05c is selected to be opposite, such that a region of null magnetic field, known as a separatrix exists between the high density plasma 615 and a region of plasma 617 adjacent to the wafer surface.

Electromagnets 605c arranged downstream of the cathode target are configured so that different currents can be applied to each electromagnet, thereby controlling an ion flux, deposition and/or etch rate and uniformity in the proximity of the wafer. A floating shield 609, existing in equilibrium with the floating plasma potential, is used, in conjunction with the source electromagnets to shape the plasma distribution at the target mouth. The ESC pedestal 603 holds the wafer substrate in place and can apply a RF bias to the wafer substrate. The ion energy, and therefore the deposition and/or etch rate can also be controlled by the pedestal RF bias. An additional function of the ESC pedestal is to provide wafer temperature control during deposition and resputtering. In a typical process the pedestal temperature can vary in the range of about −50-600° C. In practice it is often advantageous to cool the wafer pedestal down to temperatures of about −40--20° C. while the shields of an apparatus are kept at a higher temperature of about 25-500° C., preferably 100-200° C. Typically, argon or helium backside gas is used to provide thermal coupling between the substrate and the ESC.

In certain embodiments, a system controller 611 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of instructions for controlling the timing, mixture of gases, chamber pressure, chamber temperature, wafer temperature, RF power levels at the wafer, DC power levels at the target, polarity of electromagnetic coils 605b and 605c, power levels and current levels applied to the coils, wafer chuck or susceptor position, and other parameters of a particular process. Other computer programs stored on memory devices associated with the controller may be employed in some embodiments.

Typically there will be a user interface associated with controller 611. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, magnetic field within the chamber, plasma density within the chamber, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck and DC power levels applied to the target, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In one embodiment, the controller includes instructions for performing the methods described herein. For example, the instructions can specify the parameters for performing a plurality of profiling cycles, e.g., in a diffusion barrier or a copper seed deposition chamber.

EXPERIMENTAL

Figure 7A:
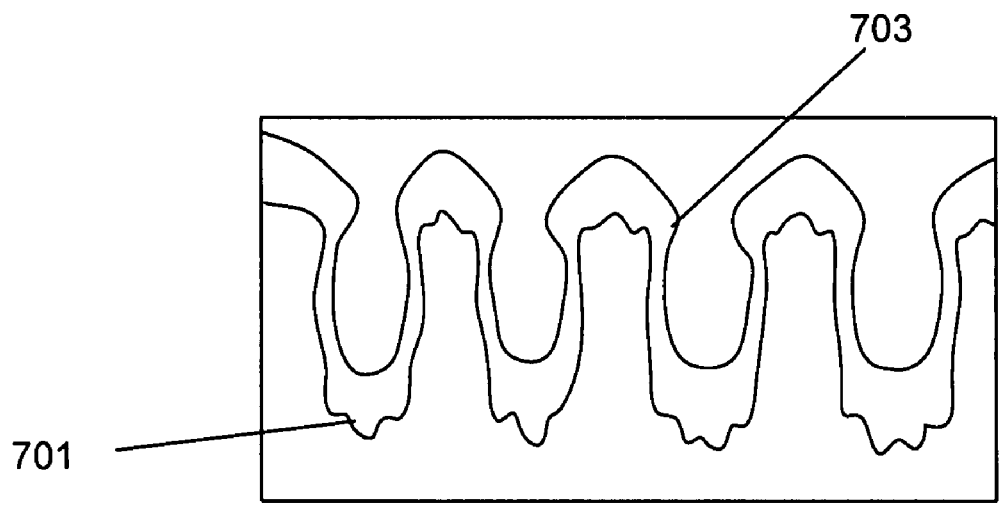
FIG. 7A is a representation of an SEM image of a narrow trench array subjected to conventional resputtering.

FIG. 7A presents a representation of an SEM image of a narrow trench array that was subjected to a D(TaNx)/D(Ta)/E(anchoring)/D(Ta) sequence. Microtrenching 701 and large overhang 703 is observed.

Figure 7B:
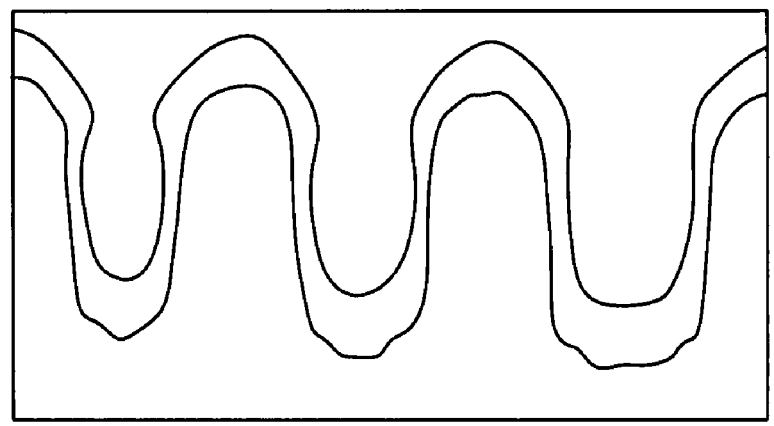
FIG. 7B is a representation of an SEM image of a narrow trench array subjected to atomic layer profiling cycles in accordance with an embodiment described herein.
Figure 7C:
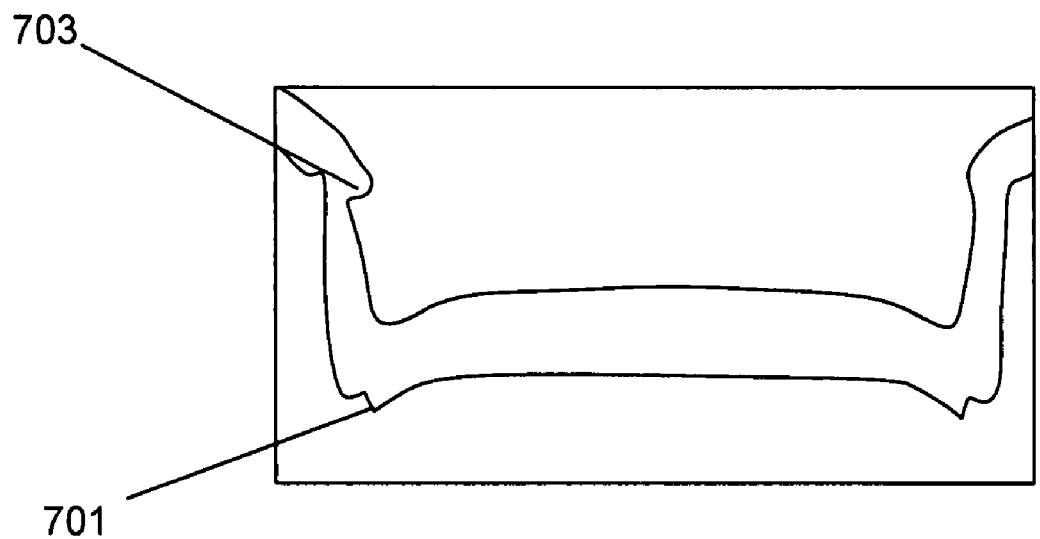
FIG. 7C is a representation of an SEM image of a wide trench subjected to conventional resputtering.

FIG. 7B presents a representation of an SEM image of a narrow trench array that was subjected to a D(TaN$_x$)/ALP/D(Ta) sequence. Low overhang and no microtrenching is observed. The aspect ratio of trenches in this array is about 2. It is noted that provided methods are very suitable for resputtering materials on substrates having high aspect ratio trenches (e.g., trenches with an aspect ratio of at least 2). Resputtering very often exposes dielectric in high aspect ratio trenches, since little selectivity exists between via bottom and trench bottom etching in this case. The following process flow has been used to obtain the illustrated device 100 Å TaN$_x$/(35 Å Ta-70 Å etchback)×3/100 Å Ta FIG. 7C presents a representation of an SEM image of a wide trench that was subjected to a D(TaN$_x$)/D(Ta)/E(anchoring)/D(Ta) sequence. Microtrenching 701 and large overhang 703 is observed.

Figure 7D:
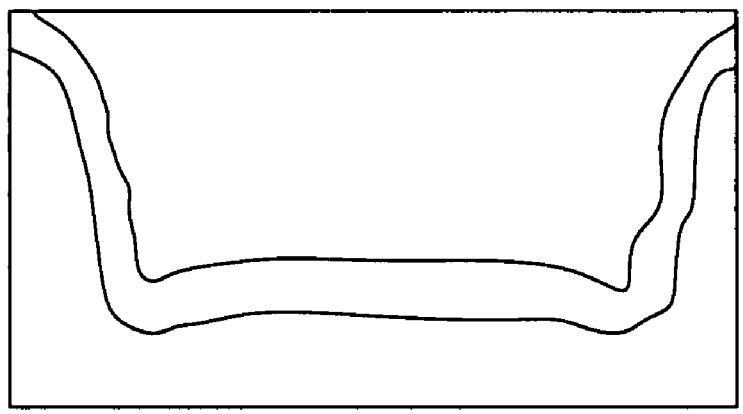
FIG. 7D is a representation of an SEM image of a wide trench subjected to atomic layer profiling cycles in accordance with an embodiment described herein.

FIG. 7D presents a representation of an SEM image of a wide trench that was subjected to a D(TaN$_x$)/ALP/D(Ta) sequence. Low overhang and no microtrenching is observed. The aspect ratio of trenches in this array is about 1. The same ALP process flow listed for FIG. 7B has been used.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of processing a layer of material on a semiconductor substrate having a recessed feature, the method comprising:
   (a) depositing a layer of a first diffusion barrier material on the semiconductor substrate, to coat at least a bottom portion of the recessed feature; and
   (b) performing a plurality of profiling cycles, wherein each profiling cycle comprises a net etching operation removing a first portion of a material residing at the bottom of the recessed feature and a net deposition operation depositing a second portion of the first diffusion barrier material at the bottom of the recessed feature, the removed portion of the material being greater than the deposited portion of the material for at least one of the profiling cycles, and wherein performing the plurality of profiling cycles achieves net material etching at the bottom portion of the recessed feature;
   (c) depositing a layer of second diffusion barrier material on the semiconductor substrate, to coat at least the bottom portion of the recessed feature; and
   (d) performing a plurality of profiling cycles, wherein each profiling cycle comprises a net etch-back operation and a net deposition operation, wherein the net deposition operation comprises depositing the second diffusion barrier material.

2. The method of claim 1, wherein (b) comprises performing 2-10 profiling cycles.

3. The method of claim 1, wherein (b) comprises performing 4-6 profiling cycles.

4. The method of claim 1, wherein (b) comprises performing 2 profiling cycles.

5. The method of claim 1, wherein (b) comprises alternating net etch and net deposition operations.

6. The method of claim 1, wherein a first profiling cycle in (b) comprises the net etch operation performed before the net deposition operation.

7. The method of claim 1, wherein a first profiling cycle in (b) comprises the net deposition operation performed before the net etch operation.

8. The method of claim 1, wherein (b) comprises removing less than about 300 Å of material from the bottom of the recessed feature per one net etching operation.

9. The method of claim 1, wherein (b) comprises removing about 100-200 Å of material from the bottom of the recessed feature per one net etching operation.

10. The method of claim 1, wherein (b) comprises removing between about 5 to 50 Å of material from the bottom of the recessed feature per one net etching operation.

11. The method of claim 1, wherein (b) comprises depositing less than about 100 Å of material in the bottom of the recessed feature per one net depositing operation.

12. The method of claim 1, wherein (b) comprises depositing between about 5 to 20 Å of material in the bottom of the recessed feature per one net depositing operation.

13. The method of claim 1, wherein (b) comprises etching between about 5 to 100 Å of material from the bottom of the recessed feature per one profiling cycle.

14. The method of claim 1, wherein (b) comprises etching between about 10 to 50 Å of material from the bottom of the recessed feature per one profiling cycle.

15. The method of claim 1, wherein (b) comprises removing between about 5 to 80 Å of material from a field region of the semiconductor substrate per one net etching operation and depositing between about 5-50 Å of material onto the field region of the semiconductor substrate per one net depositing operation.

16. The method of claim 1, wherein (b) comprises performing at least some net etching operations using resputter.

17. The method of claim 1, wherein (b) comprises performing at least some net etching operations using resputter having an etch rate to deposition rate ratio (E/D) of at least about 2 at the bottom of the recess.

18. The method of claim 1, wherein (b) comprises performing at least some net etching operations using resputter having an etch rate to deposition rate ratio (E/D) of at least about 1.1 in a field region of the semiconductor substrate.

19. The method of claim 1, wherein (a) and (b) are performed in one processing chamber.

20. The method of claim 1, wherein (a) and (b) are performed in a plasma physical vapor deposition (PVD) process chamber.

21. The method of claim 1, wherein (a) and (b) are performed in a process chamber comprising a hollow cathode magnetron.

22. The method of claim 1, wherein (a) and (b) are performed in a process chamber comprising a planar magnetron.

23. The method of claim 1, wherein (a) comprises depositing the diffusion barrier layer by a method selected from the group consisting of chemical vapor deposition (CVD), physical vapor deposition (PVD), atomic layer deposition (ALD) and pulsed deposition layer (PDL).

24. The method of claim 1, wherein (a) comprises depositing the diffusion barrier material to between about 20 and 120 Å on a field region of the semiconductor substrate.

25. The method of claim 1, wherein the recessed feature is a via, and wherein (b) comprises removing a portion of a layer of metal underlying said via to form an anchor recess.

26. The method of claim 1, wherein (b) comprises exposing a layer of dielectric in a higher-lying recessed feature, while removing material from the bottom portion of a lower lying recessed feature.

27. The method of claim 1, wherein (b) comprises removing material from the bottom portion of the recess without substantially damaging an exposed layer of a dielectric on the semiconductor substrate.

28. The method of claim 1, wherein (b) comprises removing between about 10-600 Å of material from the bottom portion of the recessed feature without substantially damaging an exposed layer of a dielectric on the semiconductor substrate.

29. The method of claim 1, wherein the semiconductor substrate comprises a via and a trench, said trench having a layer of exposed dielectric during at least one of the net etching operations; and wherein (b) comprises removing material from a bottom portion of the via without forming microtrenches in the exposed layer of the dielectric residing at the bottom of the trench.

30. The method of claim 27, wherein the exposed dielectric layer comprises a low-k or an ultra low-k dielectric.

31. The method of claim 27, wherein the exposed dielectric layer comprises a porous dielectric.

32. The method of claim 1, wherein the net deposition operation in (b) comprises depositing a first diffusion barrier material selected from the group consisting of Ta, $TaN_x$, Ti, $TiN_x$, W, $WN_x$, Ru, and Co.

33. The method of claim 1, wherein the net deposition operation in (b) comprises depositing Ta and/or $TaN_x$.

34. The method of claim 1, wherein the first diffusion barrier material comprises TaN, and the second diffusion barrier material comprises Ta.

35. The method of claim 1, further comprising depositing a flash layer of diffusion barrier material after (b) to coat at least the bottom portion of the recessed feature.

36. The method of claim 1, wherein (b) provides a diffusion barrier coverage of at least about 5 Å at bottom corners of the recessed feature.

37. The method of claim 1, wherein (b) reduces a diffusion barrier overhang located at an opening of the recessed feature.

* * * * *

UNITED STATES PATENT AND TRADEMARK OFFICE
CERTIFICATE OF CORRECTION

| | | |
|---|---|---|
| PATENT NO. | : 7,842,605 B1 | Page 1 of 1 |
| APPLICATION NO. | : 11/807179 | |
| DATED | : November 30, 2010 | |
| INVENTOR(S) | : Pradhan et al. | |

It is certified that error appears in the above-identified patent and that said Letters Patent is hereby corrected as shown below:

1. In line 2 of claim 34 (column 20, line 24) change "TaN," to --$TaN_x$--.

Signed and Sealed this
Fourteenth Day of June, 2011

David J. Kappos
*Director of the United States Patent and Trademark Office*